United States Patent
Hirayama et al.

[19]

[11] Patent Number: 5,970,081
[45] Date of Patent: Oct. 19, 1999

[54] GRATING COUPLED SURFACE EMITTING DEVICE

[75] Inventors: Yuzo Hirayama; Masahisa Funemizu; Masaki Tohyama; Motoyasu Morinaga, all of Yokohama; Keiji Takaoka, Kawasaki; Kazuhiro Inoue; Makoto Ohashi, both of Yokohama, all of Japan

[73] Assignee: Kabushiki Kaisha Toshiba, Kawasaki, Japan

[21] Appl. No.: 08/932,098

[22] Filed: Sep. 17, 1997

[30] Foreign Application Priority Data

Sep. 17, 1996 [JP] Japan .................................. 8-245054

[51] Int. Cl.$^6$ .............................. H01S 3/08; H01S 3/085
[52] U.S. Cl. ................. 372/96; 372/45; 372/50; 372/102
[58] Field of Search ................... 372/96, 45, 50, 372/102

[56] References Cited

U.S. PATENT DOCUMENTS

| 4,958,357 | 9/1990 | Kinoshita | 372/96 |
| 5,070,509 | 12/1991 | Meyers | 372/45 |
| 5,448,581 | 9/1995 | Wu et al. | 372/45 |
| 5,680,411 | 10/1997 | Ramdane et al. | 372/50 |

FOREIGN PATENT DOCUMENTS 2524068  5/1996  Japan .

OTHER PUBLICATIONS

Jun–Ichi Kinoshita, "Axial Profile of Grating Coupled Radiation from Second–Order DFB Lasers with Phase Shifts", IEEE Journal of Quantum Electronics, vol. 26, No. 3, Mar. 1990, pp. 407–412.

*Primary Examiner*—Rodney Bovernick
*Assistant Examiner*—Sung T. Kim
*Attorney, Agent, or Firm*—Oblon, Spivak, McClelland, Maier & Neustadt, P.C.

[57] ABSTRACT

A grating coupled surface emitting laser has a diffraction grating of a second or higher order for guided-mode light part of a waveguide region, and extract a beam in a direction perpendicular to the waveguide region. By narrowing a stripe of the waveguide region around the center, the phase of the diffraction grating is shifted to attain a Gaussian distribution for radiation-mode light in a cross section along the waveguiding direction.

21 Claims, 15 Drawing Sheets

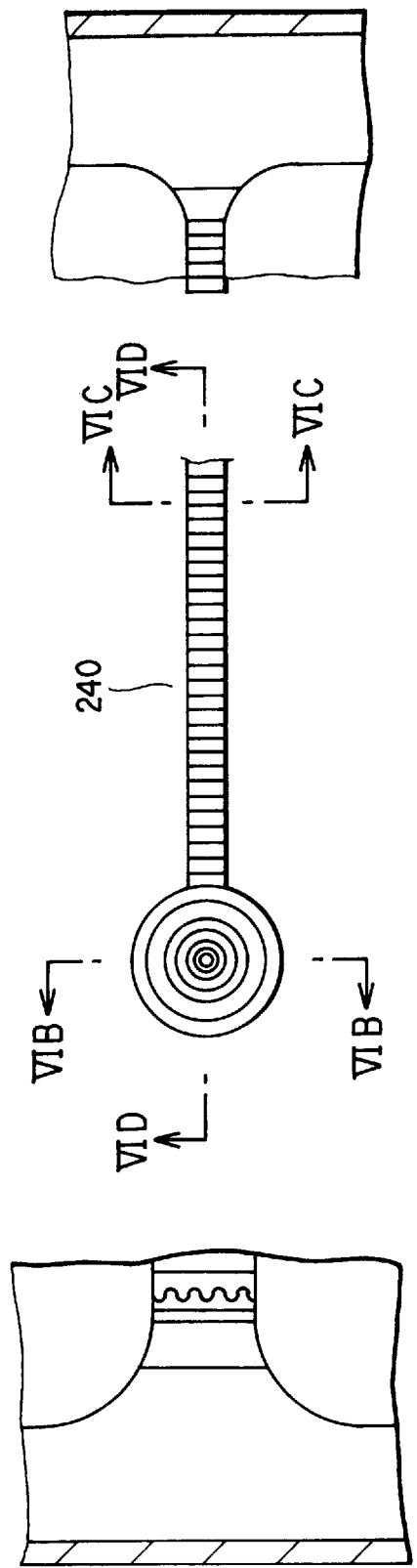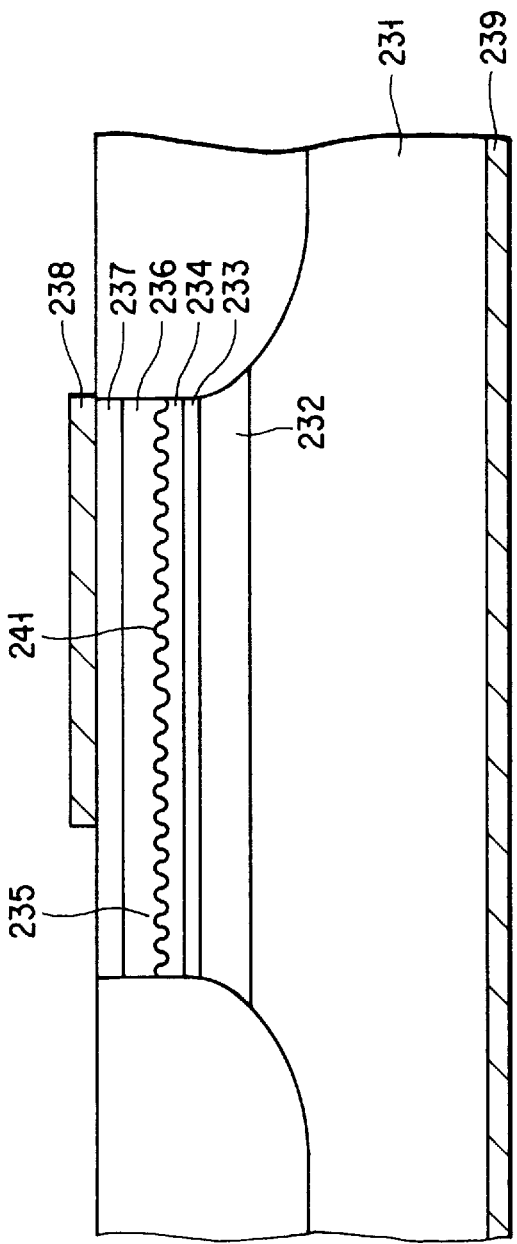

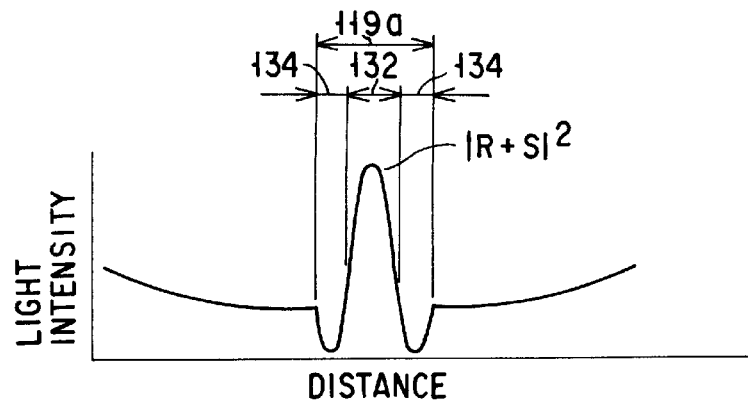
F I G. 14A
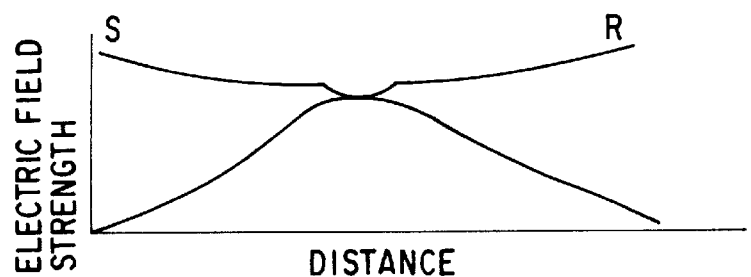
F I G. 14B
F I G. 15A
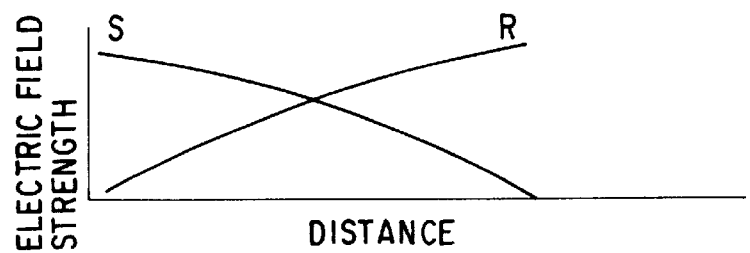
F I G. 15B
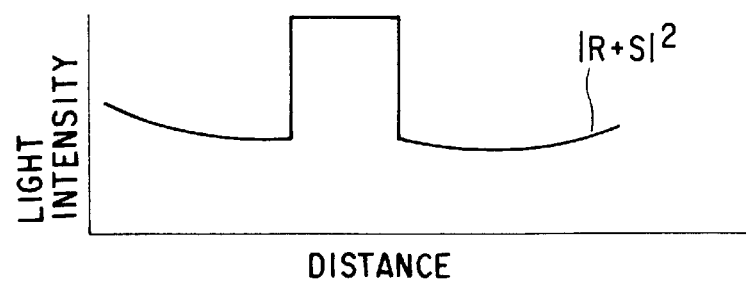
F I G. 16

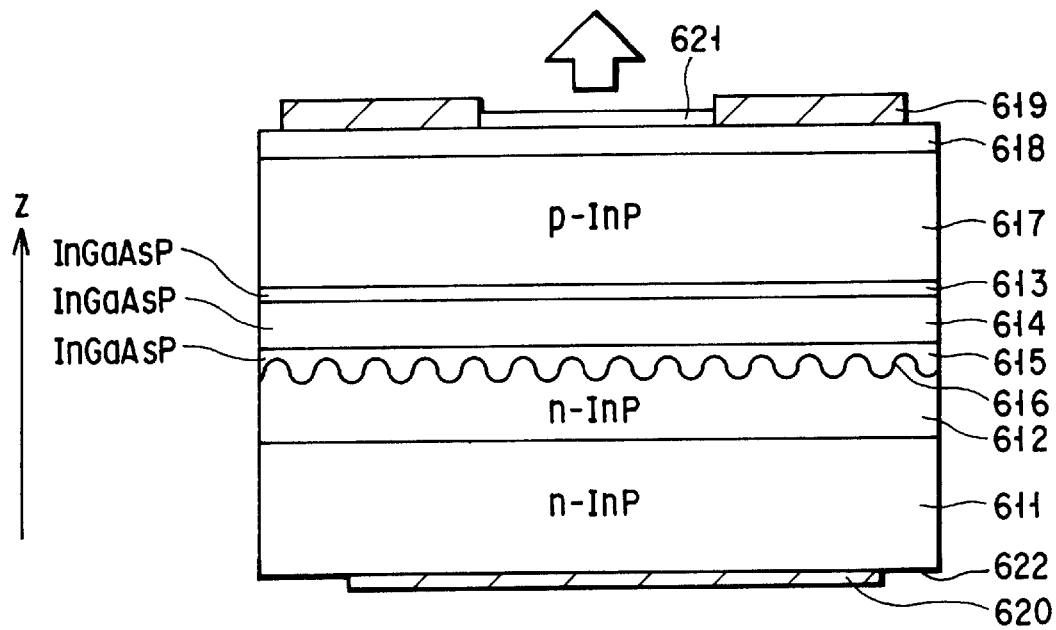
F I G. 20A
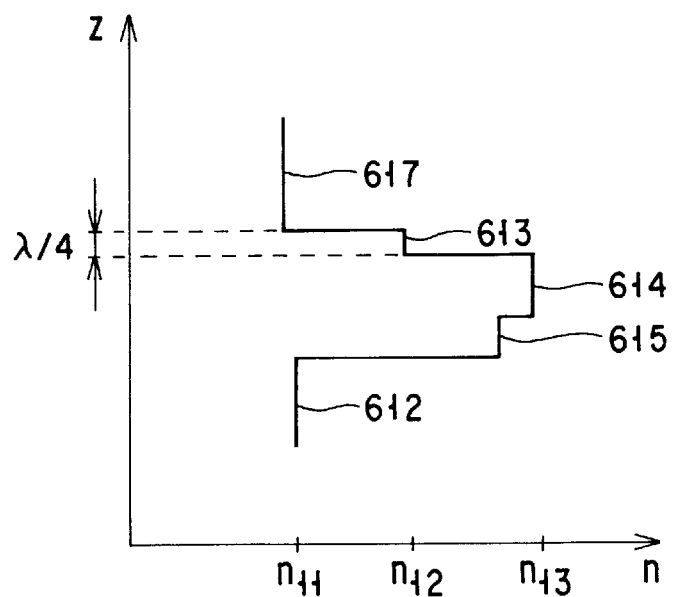
F I G. 20B

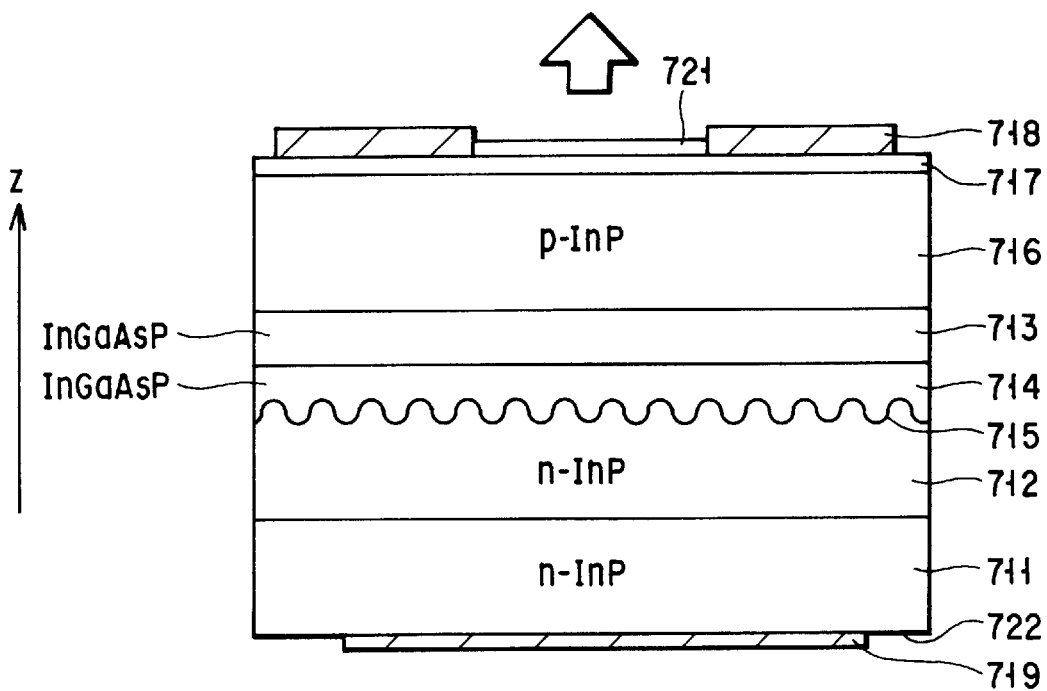
F I G. 21A
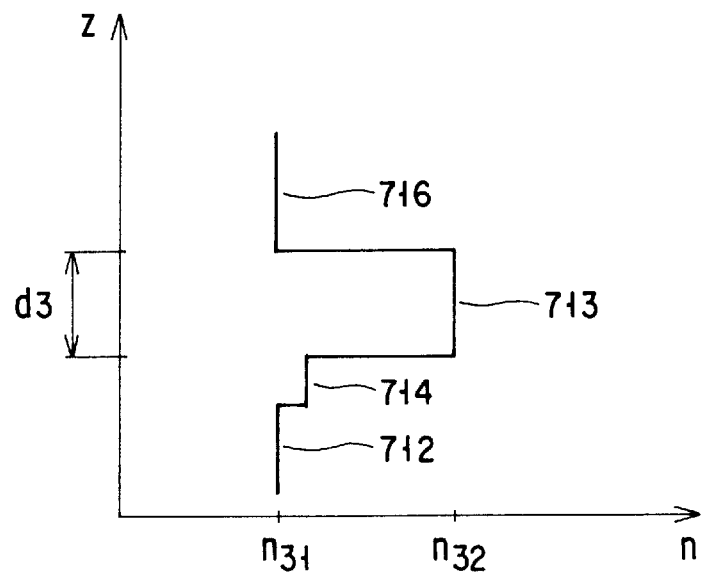
F I G. 21B

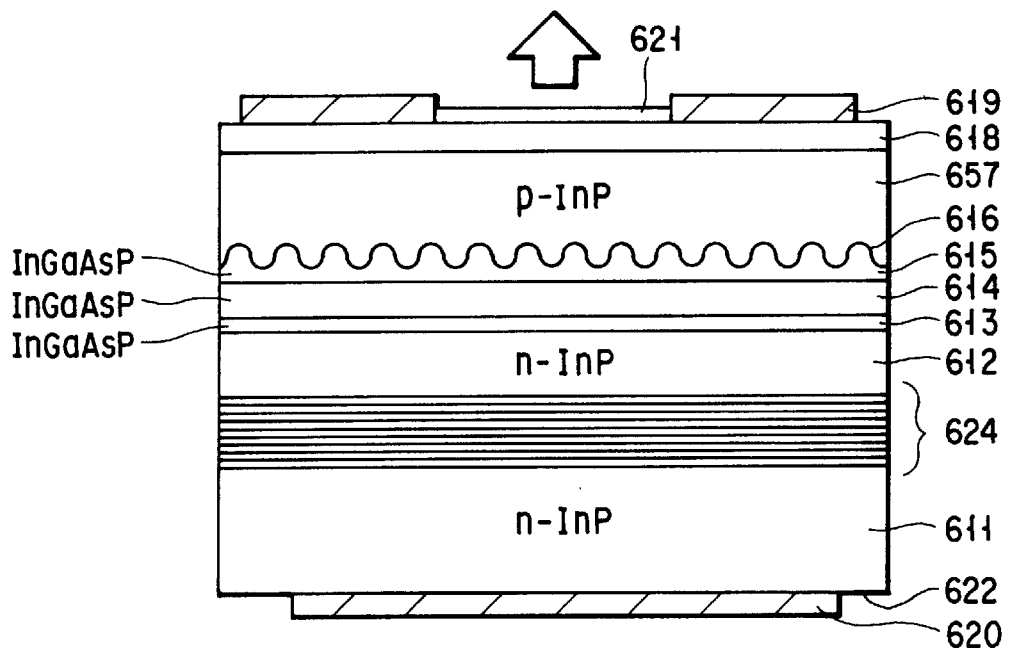
F I G. 22
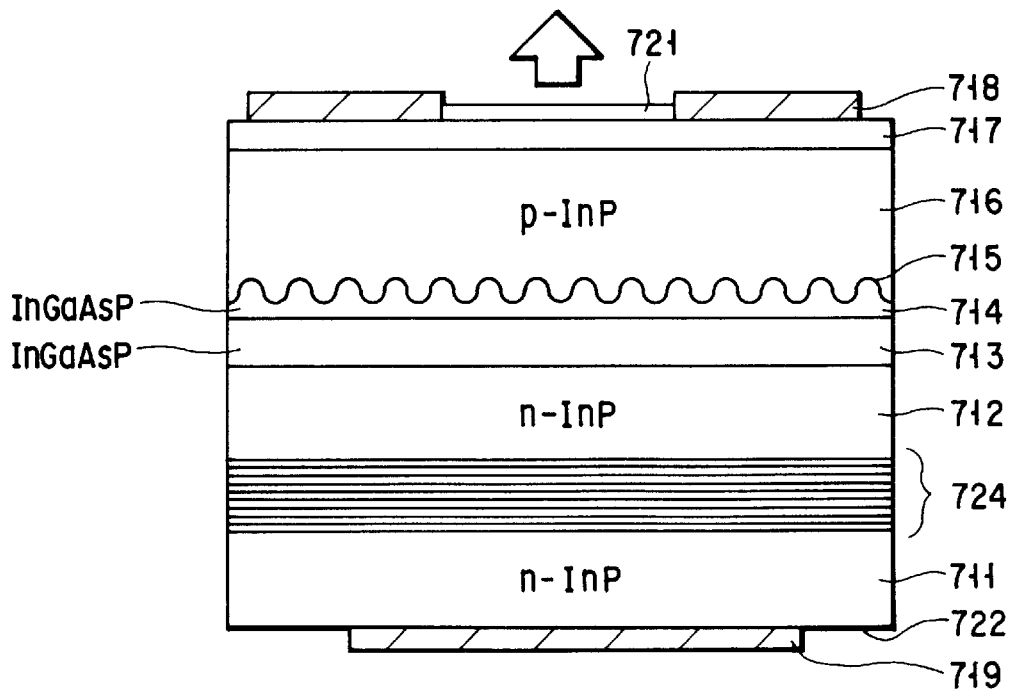
F I G. 23

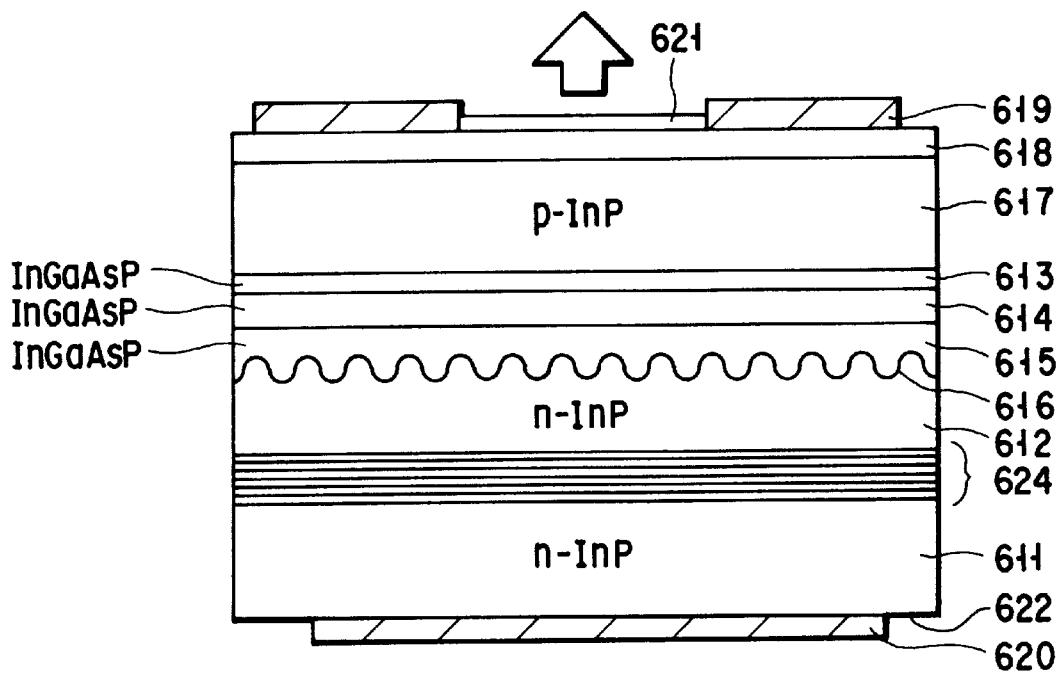
F I G. 24
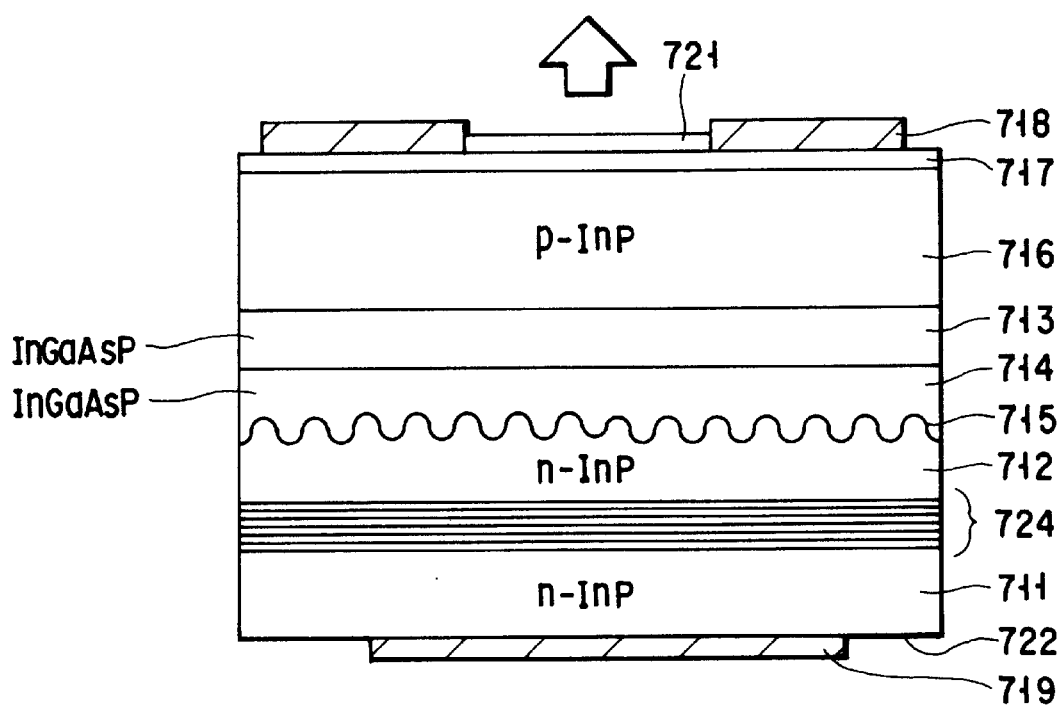
F I G. 25

GRATING COUPLED SURFACE EMITTING DEVICE

BACKGROUND OF THE INVENTION

The present invention relates to a grating coupled surface emitting device for extracting output light by a diffraction grating of the second or higher order in a direction perpendicular to the resonator direction and, more particularly, to a semiconductor laser and a semiconductor optical amplifier.

In recent years, to realize a fiber-optic subscriber system, many studies have been made for the development of low-cost light transmission/reception terminal devices. To realize a low-cost light transmission/reception terminal device, a semiconductor laser serving as a transmission light source must be directly coupled to an optical fiber without using any lens to decrease the number of components. However, since a conventional waveguide semiconductor laser and optical fiber are greatly different in spot size, the coupling efficiency is very low. In a semiconductor laser in which a spot size conversion waveguide is integrated, although a high optical coupling efficiency is obtained, the margin for the alignment precision between the semiconductor laser and the optical fiber is insufficient.

On the other hand, various optical devices for information processing have extensively been developed along with an increase in transmission information amount. Of these optical devices, a surface emitting device receives a great deal of attention because of simple parallel processing. This surface emitting device is also characterized in that optical coupling is easy due to a relatively large beam diameter. Particularly in short wavelength bands, a high-performance surface emitting laser having a sub-mA oscillation threshold.

In long wavelength bands useful in optical communication, no satisfactory surface emitting laser is reported owing to material limitations, such that a high-reflectivity mirror cannot be formed because no material system that has a large refractive index difference is available, and the materials have many non-emission components unique to themselves. For this reason, it is desired to realize a surface emitting laser having excellent features, like an edge emitting laser used in optical communication and optical interconnection.

Although a grating coupled surface emitting laser is also examined, this laser has a problem in which the output radiation-mode light has two peaks in the waveguide direction. To solve this problem, integrating a plurality of phase shift structures in the waveguide is proposed. However, the emission pattern of the radiation-mode light in this case is a rectangular pattern, which is greatly different from a Gaussian distribution as the native mode of a fiber, resulting in a very low coupling efficiency and a small tolerance against axis shift or axial misalignment.

Recently, application of a surface emitting device to parallel optical information processing and a signal connection bus line between CPUs is examined. Connecting multiple surface emitting devices requires a surface emitting semiconductor optical amplifier for preventing attenuation of light serving as a signal. Although many examples of the surface emitting semiconductor laser are reported, few examples of the surface emitting semiconductor optical amplifier are reported at present.

Report examples about the surface emitting semiconductor optical amplifier are few as the surface emitting semiconductor optical amplifier is essentially difficult to realize due to its structure, compared to a waveguide semiconductor optical amplifier. This is because, in the surface emitting semiconductor optical amplifier, an active layer serving as a gain medium which amplifies light must be made sufficiently thick. Since an active layer having a thickness of only about several microns can be stacked on a semiconductor substrate with the current crystal growth technique, a surface emitting optical amplifier capable of obtaining a sufficient amplification factor is very difficult to realize.

In this way, the use of a surface emitting laser as the transmission/reception light source of a light transmission/reception terminal device of a fiber-optic subscriber system has conventionally been examined. In a laser of this type, although the beam diameter can be increased, the oscillation threshold becomes high in long wavelength bands to weaken the optical output. In a grating coupled surface emitting laser, the emission pattern of the radiation-mode light is rectangular, which is greatly different from a Gaussian distribution as the native mode of an optical fiber. For this reason, the coupling efficiency with the optical fiber is very low, and the tolerance against axis shift is small.

In a known traveling wave type surface emitting semiconductor optical amplifier, a sufficient amplification factor cannot be obtained because the active layer is difficult to make thick.

BRIEF SUMMARY OF THE INVENTION

The present invention has been made in consideration of the above situation, and has as its object to provide a long-wavelength-band grating coupled surface emitting device capable of attaining substantially an ideal emission pattern of radiation-mode light, and increasing the coupling efficiency with an optical fiber or the like.

It is another object of the present invention to provide a traveling wave type surface emitting semiconductor optical amplifier capable of obtaining a sufficient amplification factor.

According to a first aspect of the present invention, there is provided a grating coupled surface emitting device comprising:

a semiconductor active layer;

first and second semiconductor layers of first and second conductivity types arranged to interpose the active layer therebetween;

first and second electrodes respectively connected to the first and second semiconductor layers;

a waveguide for forming guided-mode light having forward and backward wave components from light emitted from the active layer;

a diffraction grating which is arranged in the waveguide and has an order not less than a second order for the guided-mode light, the guided-mode light being output as radiation-mode light in a direction perpendicular to the waveguide by the diffraction grating from an optical output portion; and phase shift means for shifting a phase of the diffraction grating, the phase shift means being arranged in a substantially symmetrical distribution shape over a distance larger than a period of the diffraction grating so as to bring the forward and backward wave components of the guided-mode light into interference to strengthen each other at a central portion of the radiation-mode light in outputting the forward and backward wave components as the radiation-mode light, and to bring the forward and backward wave components into interference to weaken each other at portions on two sides of the radiation-mode light, thereby attaining a Gaussian distribution for the radiation-mode light.

According to a second aspect of the present invention, there is provided a grating coupled surface emitting device comprising:

a semiconductor active layer;

first and second semiconductor layers of first and second conductivity types arranged to interpose the active layer therebetween;

first and second electrodes respectively connected to the first and second semiconductor layers;

a waveguide for forming guided-mode light having forward and backward wave components from light emitted from the active layer; and a diffraction grating which is arranged in the waveguide and has an order not less than a second order for the guided-mode light, the guided-mode light being output as radiation-mode light in a direction perpendicular to the waveguide by the diffraction grating from an optical output portion, wherein a region corresponding to the optical output portion in the waveguide has an absorption edge wavelength shorter than those of regions on two sides.

According to a third aspect of the present invention, there is provided a grating coupled surface emitting device comprising:

a semiconductor active layer;

first and second semiconductor layers of first and second conductivity types arranged to interpose the active layer therebetween;

first and second electrodes respectively connected to the first and second semiconductor layers;

a waveguide for forming guided-mode light having forward and backward wave components from light emitted from the active layer;

a diffraction grating which is arranged in the waveguide and has an order not less than a second order for the guided-mode light, the guided-mode light being output as radiation-mode light in a direction perpendicular to the waveguide by the diffraction grating from an optical output portion; and a semiconductor lens which is arranged at the optical output portion, and made from a semiconductor transparent for the radiation-mode light.

According to a fourth aspect of the present invention, there is provided a grating coupled surface emitting device comprising:

a semiconductor active layer;

first and second semiconductor layers of first and second conductivity types arranged to interpose the active layer therebetween;

first and second electrodes respectively connected to the first and second semiconductor layers;

a waveguide for forming guided-mode light having forward and backward wave components from light emitted from the active layer;

a diffraction grating which is arranged in the waveguide and has an order not less than a second order for the guided-mode light, the guided-mode light being output as radiation-mode light in a direction perpendicular to the waveguide by the diffraction grating from an optical output portion; and a low-reflectivity layer arranged to oppose the diffraction grating via the active layer.

According to a fifth aspect of the present invention, there is provided a grating coupled surface emitting device comprising:

a semiconductor active layer;

first and second semiconductor layers of first and second conductivity types arranged to interpose the active layer therebetween;

first and second electrodes respectively connected to the first and second semiconductor layers;

a waveguide for forming guided-mode light having forward and backward wave components from light emitted from the active layer; and a diffraction grating which is arranged in the waveguide and has an order not less than a second order for the guided-mode light, the guided-mode light being output as radiation-mode light in a direction perpendicular to the waveguide by the diffraction grating from an optical output portion, wherein, to decrease a reflectivity of a resonator structure formed by the waveguide, the resonator structure satisfies a resonance condition for the radiation-mode light.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A to 6D are a plan view showing the schematic structure of a surface emitting laser according to still another embodiment of the present invention, and sectional views taken along the lines VIB—VIB, VIC—VIC, and VID—VID in FIG. 6A, respectively;

FIGS. 14A and 14B are graphs for explaining the radiation pattern in the embodiment shown in FIG. 1;

FIGS. 15A and 15B are graphs for explaining the radiation pattern in a conventional grating coupled surface emitting laser;

FIG. 16 is a graph for explaining the emission pattern of radiation-mode light in a laser in which a plurality of phase shift structures are integrated in a waveguide;

FIGS. 20A and 20B are a sectional view showing the schematic structure of a grating coupled surface emitting laser according to still another embodiment of the present invention, and a graph showing the refractive index of the waveguide, respectively;

FIGS. 21A and 21B are a sectional view showing the schematic structure of a grating coupled surface emitting laser according to still another embodiment of the present invention, and a graph showing the refractive index of the waveguide, respectively; and FIGS. 22 to 25 are sectional views each showing the schematic structure of a grating coupled surface emitting laser according to still another embodiment of the present invention.

DETAILED DESCRIPTION OF THE INVENTION

Figure 1A:
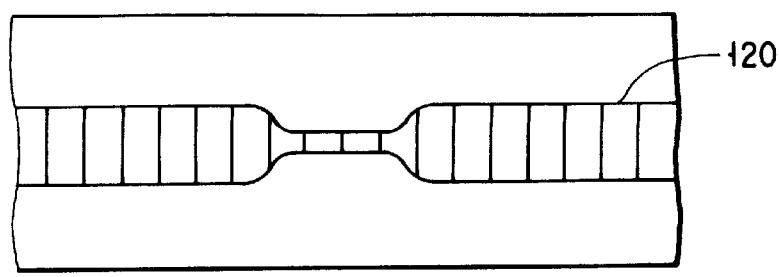
FIGS. 1A and 1B are a plan view and a sectional view, respectively, showing the schematic structure of a surface emitting laser according to an embodiment of the present invention.
Figure 1B:
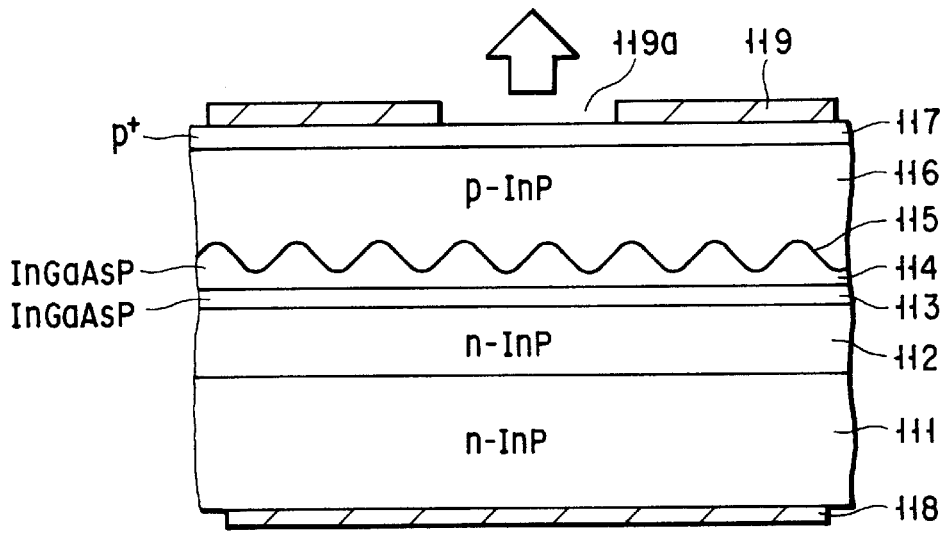

FIGS. 1A and 1B are a plan view and a sectional view, respectively, showing the schematic structure of a grating coupled surface emitting laser according to an embodiment of the present invention.

As shown in FIGS. 1A and 1B, a 1.0-$\mu$m thick n-InP cladding layer 112, a 0.1-$\mu$m thick InGaAsP active layer 113 (composition wavelength: 1.55 $\mu$m), and a 0.1-$\mu$m thick InGaAsP waveguide layer 114 (composition wavelength: 1.3 $\mu$m) are formed on an n-InP substrate 111. A second-order diffraction grating 115 having a period of 480 nm is formed on the waveguide layer 114. The waveguide layer 114 is etched into a narrow stripe 120 over 20 $\mu$m around the center.

A p-InP cladding layer 116 and a p$^+$-contact layer 117 are grown on the exposed waveguide layer 114 and the active layer 113. A p-side electrode 119 having an output opening 119a is arranged on the contact layer 117. An n-side electrode 118 is arranged on the lower surface of the substrate 111. The respective layers 112, 113, 114, 116, and 117 are formed by metal organic chemical vapor deposition (MOCVD).

According to the laser of this embodiment, the emission output pattern of the radiation-mode light has a Gaussian distribution in a cross section along the waveguiding direction. In this case, since the native mode of an optical fiber and the radiation mode are substantially concordant with each other, the coupling efficiency with the optical fiber can increase to almost 100%. This advantage is obtained by forming, on the waveguide layer 114, the diffraction grating 115 of the second order for guided-mode light, and narrowing or constricting the waveguide stripe 120 so as to attain a symmetrical distribution in the waveguiding direction within a predetermined section.

More specifically, emitted light from the active layer 113 becomes guided-mode light having first and second direction components (forward and backward waves R and S shown in FIG. 14B) which are guided along the waveguide in directions opposite to each other. The guided-mode light is output from the diffraction grating 115 as radiation-mode light in a direction perpendicular to the waveguide.

The constricted shape at the center of the waveguide stripe 120 functions as a phase shift means for equivalently shifting the phase of the diffraction grating 115. The narrow portion of the waveguide stripe 120, i.e., the phase shift means is arranged in a substantially symmetrical distribution shape over a region longer than the period of the diffraction grating 115. The phase shift means is set such that, when the first and second direction components (forward and backward waves R and S) of the guided-mode light are output as radiation-mode light, they interfere with each other so as to intensify each other at the central portion of the radiation-mode light, and interfere so as to weaken each other at the two side portions of the radiation-mode light. With this setting, the radiation-mode light has a Gaussian distribution.

FIG. 14A shows the light intensity distribution of radiation-mode light having a Gaussian distribution obtained in the above manner. FIG. 14A also shows the relationship between the output opening 119a, a region 132 where the forward and backward waves R and S interfere with each other so as to intensify each other, and a region 134 where the forward and backward waves R and S interfere with each other so as to weaken each other.

Figure 2:
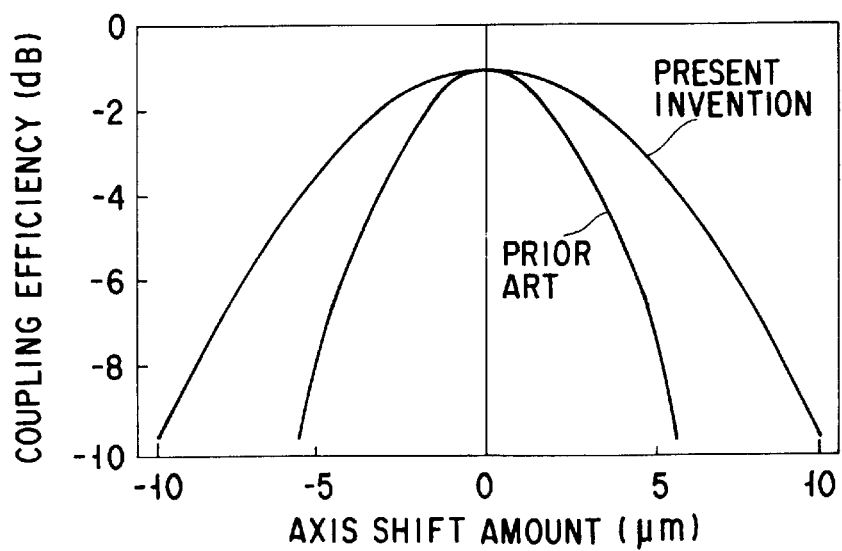
FIG. 2 is a graph showing the measurement results of axis shift tolerance with an optical fiber in the embodiment shown in FIG. 1.

When the emission pattern of the laser in this embodiment was observed, a Gaussian distribution having a spot size (diameter) of 18 $\mu$m was obtained. The threshold was 5 mA, and the optical output was 10 mW. FIG. 2 shows the measurement results of the axis shift tolerance with an optical fiber in this embodiment. The tolerance was found to be much larger than that of a conventional spot size conversion laser.

In addition to the arrangement of this embodiment, a first-order diffraction grating having a diffraction grating period of 240 nm was arranged over a distance of 50 $\mu$m from the two ends of the waveguide except for a 20-$\mu$m long central portion, and an experiment was conducted. In this case, since there was no radiation mode from the two ends, more efficient emission was possible to obtain an output of 15 mW.

The principle of the structural feature in this embodiment will be described in detail below.

As described above, a conventional grating coupled surface emitting optical device has a problem in which radiation-mode light emitted toward the surface has two peaks in the waveguide direction, as shown in FIG. 15A. This is known to be attributable to the interference effect between the forward and backward waves R and S in the waveguide, as shown in FIG. 15B. To solve this problem, integrating a plurality of phase shift structures in the waveguide is proposed. However, since the diffraction grating phase abruptly changes, the emission pattern of the radiation-mode light in this case is a rectangular pattern, as shown in FIG. 16. This rectangular pattern is greatly different from a Gaussian distribution as the native mode of the fiber. For this reason, the coupling efficiency with the fiber is very low, and the tolerance against axis shift is small.

It is therefore very significant to form a diffraction grating of a second or higher order, and have a phase shift means for gradually shifting the phase, as in the present invention. In this arrangement, since the phase is gradually shifted, the interference effect between the forward and backward waves R and S also gradually changes. That is, the interference effect with which optical outputs weaken each other along the waveguide direction gradually changes to the interference effect with which they intensify each other. Therefore, the emission output pattern of the radiation-mode light in the waveguiding direction can be freely controlled by adjusting the manner of changing the phase shift amount. If the phase shift amount is changed to have a symmetrical distribution, and the forward and backward waves R and S are changed as shown in FIG. 14B, a Gaussian distribution can be attained for the radiation-mode light, as shown in FIG. 14A.

Since the spot size can be substantially defined by the length of the region where the phase shifts, a Gaussian distribution having a spot size of 10 $\mu$m or more can be attained. In this case, since the native mode of the optical fiber and the radiation mode can be nearly matched with each other, the coupling efficiency can increase to almost 100%. Since the fundamental structure substantially directly utilizes the structure of a conventional edge emitting device which can present high performance, the remaining laser fundamental features are also excellent. Consequently, a high-performance long-wavelength-band surface emitting laser in which optical coupling is easy, and the oscillation threshold is low can be obtained.

As the means for gradually shifting the phase, a so-called equivalent phase shift method of changing the width or thickness of the waveguide stripe within a predetermined section, as shown in FIG. 1A is convenient. Although the center of the waveguide stripe 120 has a smaller width in the above described embodiment, it is possible to adopt a design in that the center has a larger width. As will be described later, the same effects can be obtained by using a chirped grating which gradually changes the period of the diffraction grating itself.

Figure 3:
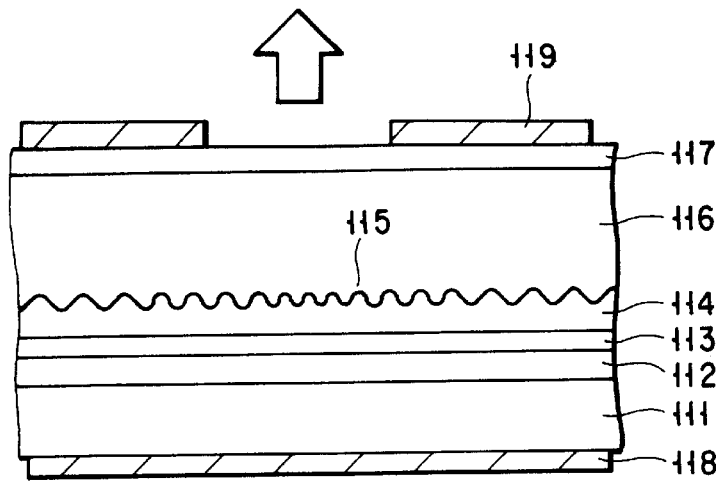
FIG. 3 is a sectional view showing the schematic structure of a surface emitting laser according to another embodiment of the present invention.

FIG. 3 is a sectional view showing the schematic structure of a grating coupled surface emitting laser according to another embodiment of the present invention. Since the fundamental arrangement of this embodiment is the same as that in the embodiment shown in FIGS. 1A and 1B, the same reference numerals denote the same parts, and a detailed description thereof will be omitted.

This embodiment is different from the embodiment in FIGS. 1A and 1B in that the period of a diffraction grating 115 formed on a waveguide layer 114 remains to be 480 nm at the periphery, but is gradually shortened toward the center. The stripe width of the waveguide layer 114 may be uniform, increased or decreased within a predetermined section at the center, similar to the above embodiment. The period of the diffraction grating 115 may be designed to be gradually lengthened toward the center. Where the stripe width of the wave guide layer 114 is set larger at the center, spatial hole burning in the axial direction can be suppressed, thereby obtaining a stable operation even at a high output.

Also with the arrangement of this embodiment, a Gaussian distribution can be attained for the emission output pattern of the radiation-mode light in the waveguiding direction, and the same effects as those in the above embodiment can be obtained. Again, since the native mode of the optical fiber and the radiation mode can be substantially concordant with each other, the coupling efficiency with the optical fiber can increase to almost 100%.

Although the above-described two embodiments use an InP system as a material system, a GaAs system may be used instead. A plurality of devices can be integrated on a single substrate. The diffraction region and the emission region may be different from each other.

Figure 4:
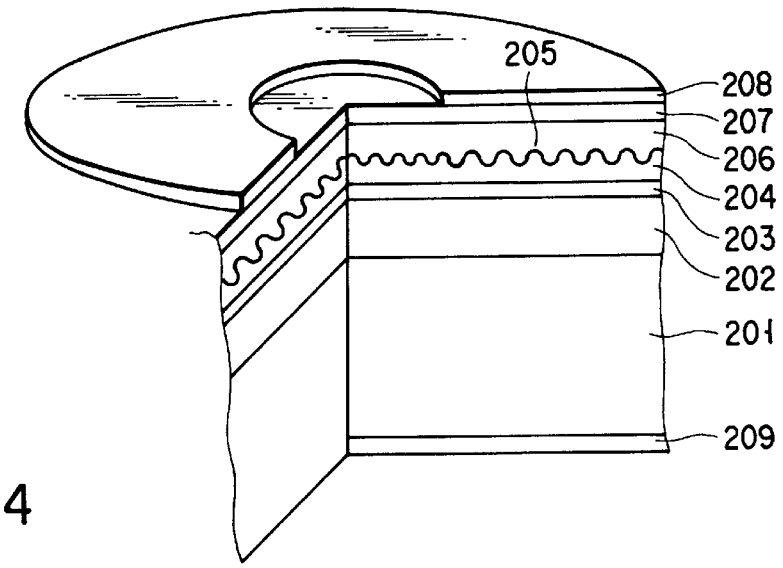
FIG. 4 is a partially cutaway perspective view showing the schematic structure of a surface emitting laser according to still another embodiment of the present invention.

FIG. 4 is a partially cutaway perspective view showing the schematic structure of a grating coupled surface emitting laser according to still another embodiment of the present invention.

As shown in FIG. 4, an n-InP cladding layer 202, an InGaAsP active layer 203 (composition wavelength: 1.55 $\mu$m), an InGaAsP waveguide layer 204 (composition wavelength: 1.3 $\mu$m), a second-order diffraction grating 205 having a period of 480 nm, a p-InP cladding layer 206, and a $p^+$-contact layer 207 are formed on an n-InP substrate 201. An n-side electrode 208 and a p-side electrode 209 are respectively arranged on the $p^+$-contact layer 207 and the lower surface of the n-InP substrate 201.

This embodiment is different from the above two embodiments in that the diffraction grating is concentrically formed. The phase of the second-order diffraction grating 205 is shifted from the center over a radius of 10 $\mu$m. More specifically, the period gradually decreases from a position having a radius of 10 $\mu$m to the center.

When the emission pattern of the laser in this embodiment was observed, a Gaussian distribution having a spot size (diameter) of 18 $\mu$m was obtained. The threshold was 5 mA, and the optical output was 10 mW. The axis shift tolerance with an optical fiber was measured to obtain the results shown in FIG. 2. The tolerance was found to be much larger than that of the conventional spot size conversion laser.

Figure 5:
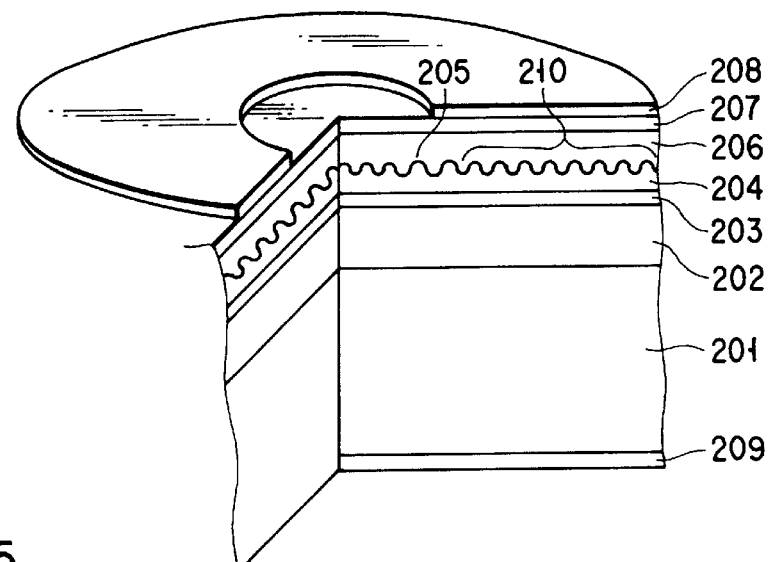
FIG. 5 is a partially cutaway perspective view showing the schematic structure of a surface emitting laser according to still another embodiment of the present invention.

FIG. 5 is a partially cutaway perspective view showing the schematic structure of a grating coupled surface emitting laser according to still another embodiment of the present invention. Since the fundamental arrangement of this embodiment is the same as that of the embodiment shown in FIG. 4, the same reference numerals denote the same parts, and a detailed description thereof will be omitted.

Also in this embodiment, a second-order diffraction grating 205 is formed such that its phase shifts from the center over a radius of 10 $\mu$m. This embodiment is different from the embodiment shown in FIG. 4 in that a first-order diffraction grating 210 having a diffraction grating period of 240 nm is formed over a radius of 100 $\mu$m in an outer region except for the center.

With this arrangement, the same effects as those in FIG. 4 are obtained, as a matter of course. In addition, no radiation mode from the periphery exists. In an experiment, more efficient emission was possible to obtain an optical output of 15 mW.

FIGS. 6A to 6D are a plan view showing the schematic structure of a grating coupled surface emitting laser according to still another embodiment of the present invention, and sectional views taken along the lines VIB—VIB, VIC—VIC, and VID—VID in FIG. 6A, respectively.

An n-InP cladding layer 232, an InGaAsP active layer 233 (composition wavelength: 1.55 μm), an InGaAsP waveguide layer 234 (composition wavelength: 1.3 μm), a second-order diffraction grating 235 having a period of 480 nm, a p-InP cladding layer 236, and a p$^+$-contact layer 237 are formed on an n-InP substrate 231. An n-side electrode 238 and a p-side electrode 239 are respectively arranged on the p$^+$-contact layer 237 and the lower surface of the n-InP substrate 231. Similar to the embodiment shown in FIG. 4, the phase of the second-order diffraction grating 235 is shifted from the center over a radius of 10 μm. A stripe active region 240 having a length of 200 μm is formed outside along the longitudinal direction. In the embodiment shown in FIGS. 6A to 6D, a first-order diffraction grating 241 having a period of 240 nm is further formed in the stripe active region 240.

In this embodiment, the threshold of a current required for oscillation can be reduced by effectively using the active region. In an experiment, the laser oscillated with an injection current of only 2 mA.

Figure 7A:
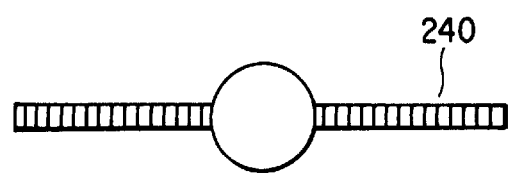
FIGS. 7A to 7C are schematic views, respectively, showing modifications of a stripe active region shown in FIG. 6A.
Figure 7B:
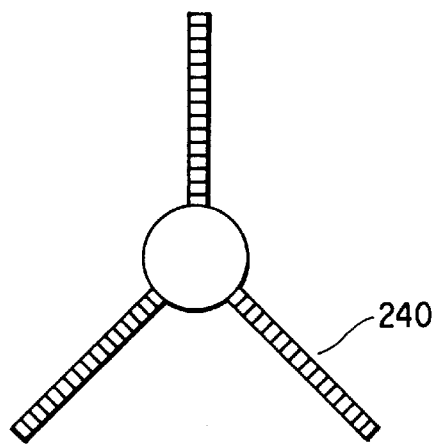
Figure 7C:
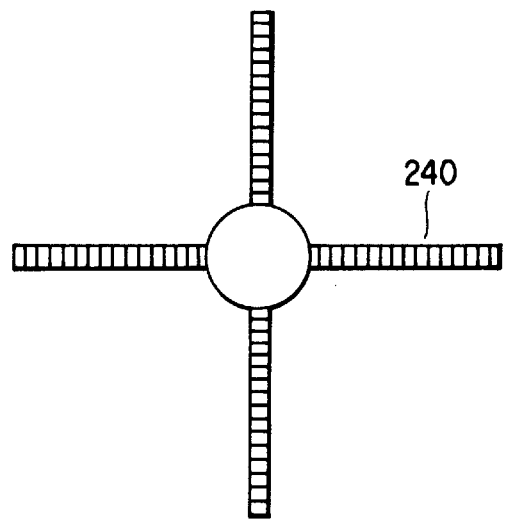

The stripe active region is not limited to the one shown in FIGS. 6A to 6D, and can be properly changed like the one shown in FIGS. 7A to 7C.

Figure 8:
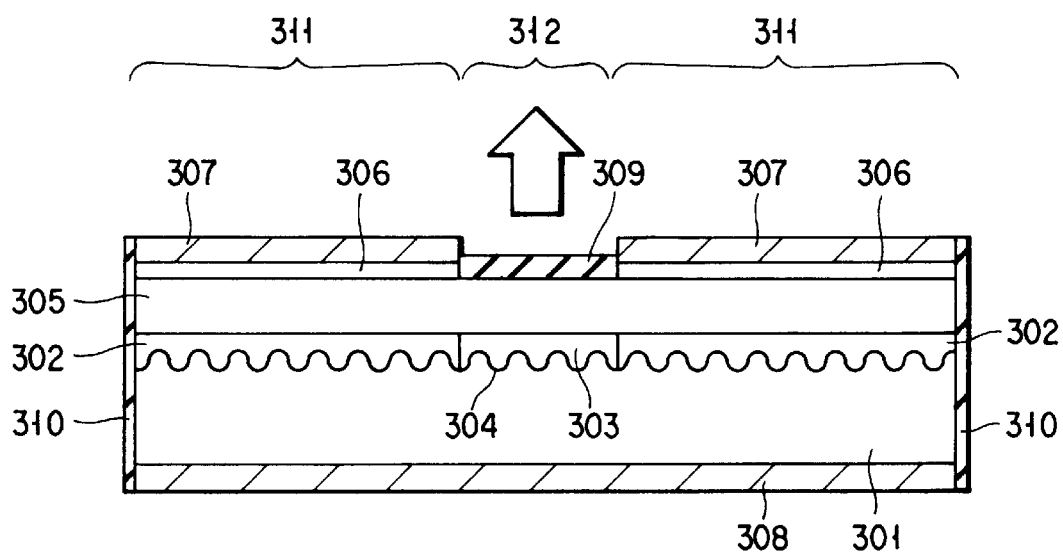
FIG. 8 is a sectional view along the waveguiding direction showing the schematic structure of a DFB laser according to still another embodiment of the present invention.

FIG. 8 is a sectional view of a grating coupled surface emitting laser according to still another embodiment of the present invention, and particularly a distributed feedback semiconductor laser (DFB laser) along the waveguiding direction.

As shown in FIG. 8, an InGaAsP active layer 302, an InGaAsP optical waveguide layer 303, a second-order diffraction grating 304 with the above-described phase shift means, a p-InP cladding layer 305, and a p-InGaAs contact layer 306 are formed on an n-InP substrate 301. A p-ohmic electrode 307 made from Au/Zn/Au, and an n-ohmic electrode 308 made from AuGe/Ni/Au are respectively arranged on the p-InGaAs contact layer 306 and the lower surface of the n-InP substrate 301. A light extraction region 312 covered with an insulating layer 309 made from SiO$_2$ is set at the center of an active region 311. The side portions of the device are covered with anti-reflection films 310 made from SiN$_x$.

The composition wavelength and oscillation wavelength of the active layer 302 are 1.56 μm, and the composition wavelength of the optical waveguide layer 303 is 1.48 μm. In the light extraction region 312, no p-InGaAs contact layer 306 and no p-ohmic electrode 307 are formed above the optical waveguide layer 303 so as not to shield the emitted beam. For this reason, no carrier can be injected in the optical waveguide layer 303.

However, since the composition wavelength of the optical waveguide layer 303 is set at 1.48 μm, an oscillating beam having a wavelength of 1.56 μm can be guided through the light extraction region 312 without being attenuated by the optical waveguide layer 303. That is, in this embodiment, by changing the composition in the waveguide region, the absorption edge wavelength of the light extraction region 312 is set sufficiently shorter than those of the active regions 311 on the two sides. With this setting, an optical output can be extracted upward without decreasing it to obtain an optical output about two times a conventional optical output.

Figure 9:
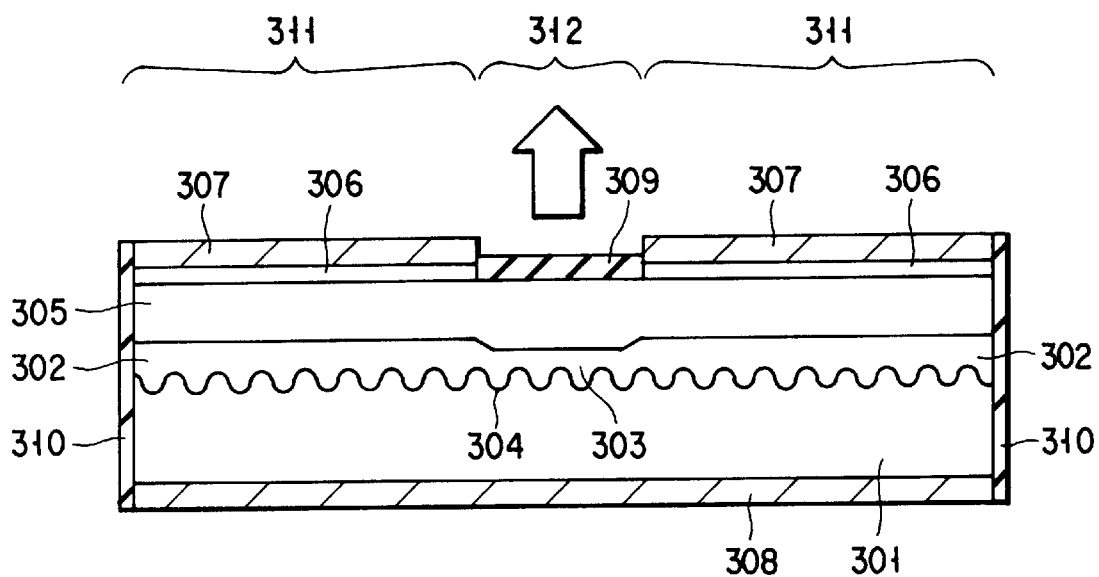
FIG. 9 is a sectional view along the waveguiding direction showing the schematic structure of a DFB laser according to still another embodiment of the present invention.

FIG. 9 is a sectional view along the waveguiding direction showing a DFB laser according to still another embodiment of the present invention. The same reference numerals as in FIG. 8 denote the same parts, and a detailed description thereof will be omitted.

In this embodiment, an active layer 302 and an optical waveguide layer 303 are formed from InGaAsP multiple quantum well layers having different well widths. More specifically, the active layer 302 and the optical waveguide layer 303 are fabricated by selective growth. The well width of the optical waveguide layer 303 is smaller than that of the active layer 302, and the absorption edge wavelength of the optical waveguide layer 303 is 70 nm shorter than the oscillation wavelength. That is, in this embodiment, by changing the well width of the multiple quantum well layer in the waveguide region, the absorption edge wavelength of a light extraction region 312 is set sufficiently shorter than those of active regions 311 on the two sides. Therefore, even if no carrier is injected in the light extraction region 312, the oscillating beam can be guided without attenuation.

Since the active layer 302 and the optical waveguide layer 303 are different in thickness, their mode refractive indexes are also different. For this reason, the light extraction region 312 equivalently functions as the phase shift means, though the period of a diffraction grating 304 is constant, and the width of the waveguide stripe is uniform. In this embodiment, emission having a Gaussian distribution can be attained on a cross section along the resonator direction. As a result, the coupling efficiency with the optical fiber is high, and the margin for alignment precision is large.

To obtain emission having a Gaussian distribution which is suitable for coupling with an optical fiber, control of the phase shift amount is very important. In this embodiment, the period of the diffraction grating 304 and the stripe width of the waveguide layer need not be changed, and the phase shift amount is determined by the thicknesses of the active layer 302 and the optical waveguide layer 303, and the length of the light extraction region 312. Accordingly, the phase shift amount can be controlled with a very high precision.

More specifically, the embodiments shown in FIGS. 8 and 9 have the second-order diffraction grating in at least part of the resonator direction. In the waveguide of the laser for radiating an oscillating beam in a direction perpendicular to the resonator direction, the absorption edge wavelength of the light extraction region is set to be sufficiently shorter than those of regions on the two sides. With this setting, even if no carrier is injected, the oscillating beam can be guided through the light extraction region without attenuation. Therefore, an optical output can be extracted in a direction perpendicular to the waveguiding direction without being decreased. The features of these embodiments about the absorption edge wavelength can also be utilized when no phase shift means for attaining a Gaussian distribution is used.

The embodiments shown in FIGS. 8 and 9 have exemplified the InGaAsP-based semiconductor laser. However, the present invention is not limited to this, and can be applied to various material systems such as an AlGaInP system, an InGaAsSb system, and a ZnCdSSe system. Although these embodiments have exemplified the DFB laser having a second-order diffraction grating over the entire resonator, the second-order diffraction grating suffices to be arranged in at least the light extraction region. The present invention is also effective for a Distributed Bragg reflection semiconductor laser (DBR laser). A bulk material or a multiple quantum well structure may be used for the optical waveguide layer. Further, the conductivity type of the semiconductor substrate is not limited to n-type.

Figure 10:
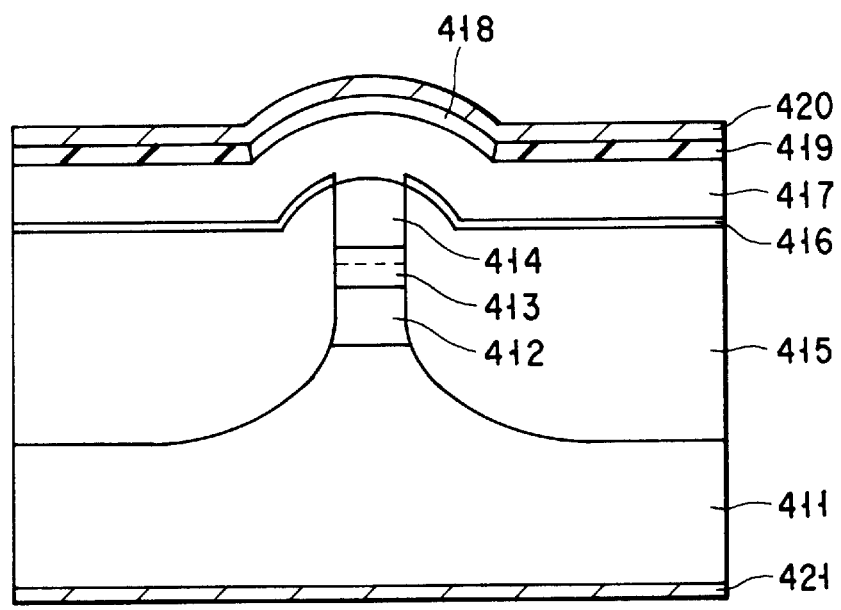
FIG. 10 is a sectional view showing the schematic structure of a surface emitting laser according to still another embodiment of the present invention.

FIG. 10 is a sectional view showing the schematic structure of a grating coupled surface emitting laser according to still another embodiment of the present invention. To fabricate the following structure, MOCVD is used.

As shown in FIG. 10, an n-InP cladding layer 412, an InGaAsP active layer 412 (composition wavelength: 1.55 μm), and an InGaAsP light guide layer 413 (composition wavelength: 1.3 μm) are deposited on an n-InP substrate 411. After a second-order diffraction grating having a period of 480 nm is formed on the light guide layer 413, the diffraction grating is filled with a p-InP layer 414.

A mesa shape is fabricated using an SiO$_2$ film, and the mesa side surfaces are buried with semi-insulating InP layers 415. At this time, the shape of a cylindrical lens can be controlled by the burying depth, the thickness of the p-InP layer 414, the width of the SiO$_2$ film, and the like. An n-InP layer 416 serving as a current block layer is selectively deposited in a region except for the upper portion of the mesa. A p-InP cladding layer 417 and a p-InGaAs(P) contact layer 418 are deposited on the resultant structure.

The contact layer 418 is patterned, an SiO$_2$ film 419 is deposited, and an electrode 420 is formed. More specifically, the contact layer 418 is removed except for a region from the mesa portion to predetermined-distance portions on the two sides, and a light extraction region. The SiO$_2$ film 419 is deposited on the removed portion of the contact layer 418, and then the Au/AuZn electrode 420 is formed. An Au/AuGe electrode 421 is formed on the lower surface of the device.

Figure 11A:
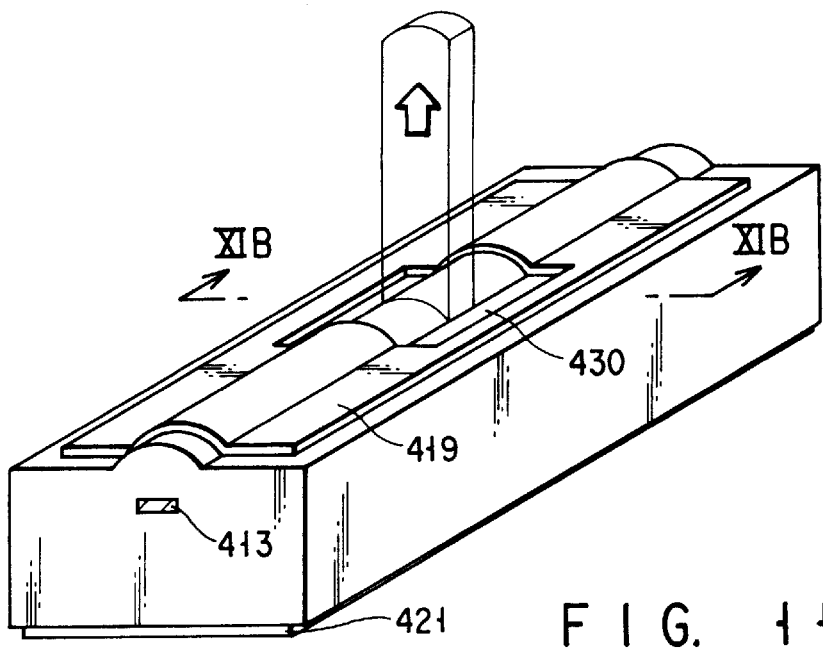
FIGS. 11A and 11B are schematic views, respectively, showing the emission pattern in the embodiment shown in FIG. 10.
Figure 11B:
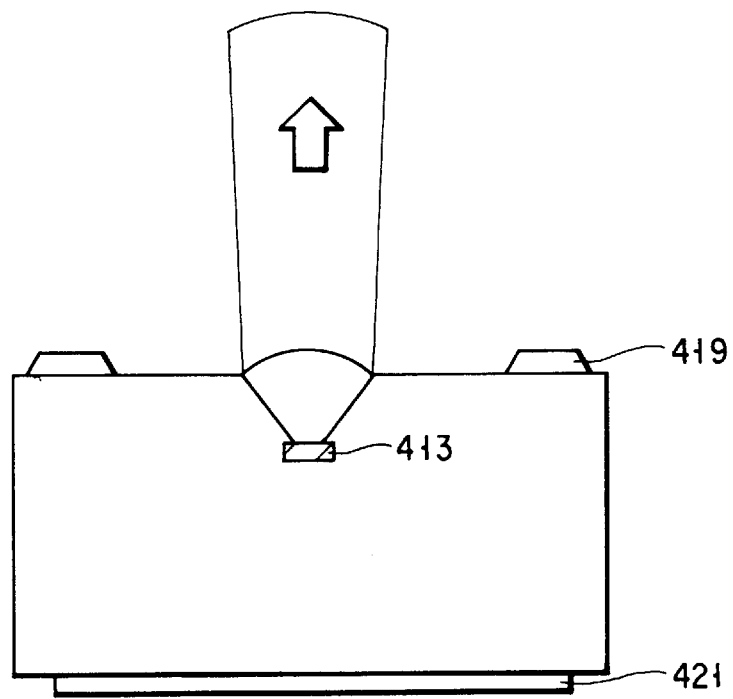

To form the light extraction region, the p-InGaAs(P) contact layer 418 is removed by patterning in this region. No electrode 420 is formed in this region upon deposition of the SiO$_2$ film 419. Accordingly, a light extraction region 430 is formed, as shown in FIGS. 11A and 11B.

The radiation angle in a direction perpendicular to the waveguide of the fabricated surface emitting laser was measured to be about 5° in this embodiment; it was smaller than the conventional angle of 35°. This value is a small fraction of the radiation angle of the edge emitting semiconductor laser. The oscillation threshold was 12 mA, and the optical output was 10 mW.

According to this embodiment, the radiation-mode light can be controlled by inserting a convex lens or a Fresnel lens made from a semiconductor transparent for radiation-mode light on the surface of a semiconductor which emits a beam. The conventional surface emitting laser emits a beam in a fan shape, whereas the surface emitting laser having a semiconductor lens in this embodiment can radiate a beam into a circular spot, which has a diameter almost equal to the spot diameter of the optical fiber. This is because the lens is formed into a cylindrical shape so as to act on the radiation mode in a direction perpendicular to the waveguide direction, as shown in FIG. 11B.

The radiation angle can be freely controlled because the semiconductor lens is a semiconductor layer transparent for the emission wavelength, and the size of the cylinder and the position from the emitting layer can be freely controlled. In formation of a conventional flat electrode, since the current greatly spreads, the contact resistance increases to increase the oscillation threshold of the laser. In this embodiment, a cylindrical structure similar to the light extraction region can also be employed in a power feed region where the current is injected. In this case, spread of the current can be suppressed, and the contact resistance can be reduced to attain a surface emitting laser having a low threshold.

Although the active layer is made from InGaAsP having a composition wavelength of 1.55 μm in this embodiment, it is not limited to this, and can be properly changed. This embodiment has exemplified the InGaAsP/InP system, but the present invention can be applied to red- and blue-beam emitting material systems.

An embodiment in which the present invention is applied to a surface semiconductor optical amplifier will be described below.

Figure 12A:
FIGS. 12A to 12C are views for explaining the radiation pattern in the embodiment shown in FIGS. 13A to 13C.
Figure 12B:
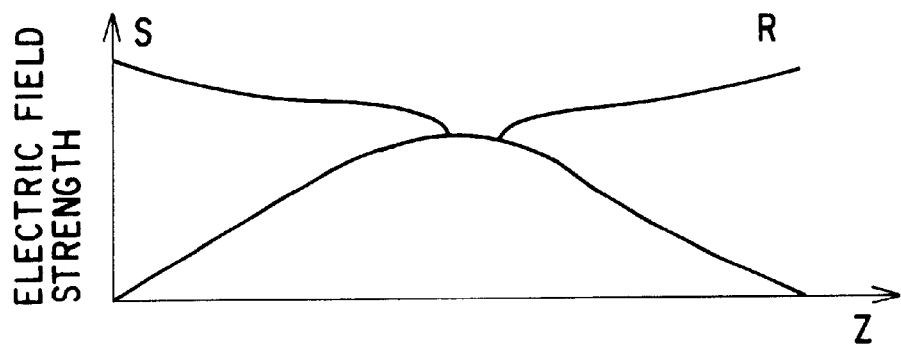
Figure 12C:
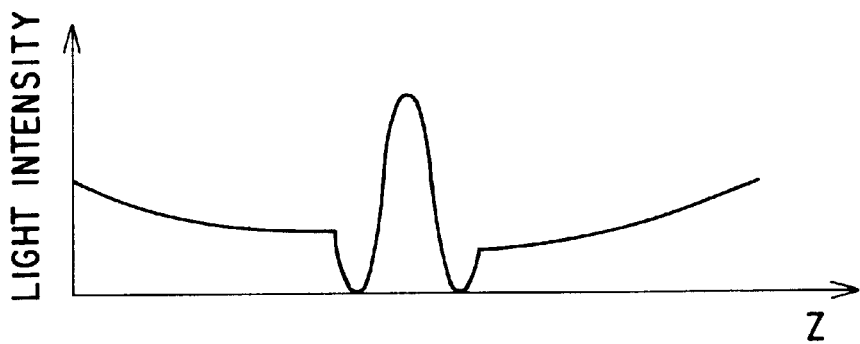

FIGS. 12A to 12C are views for explaining a radiation pattern in a direction perpendicular to the substrate in a case using a so-called equivalent phase shift structure in which the phase is shifted by narrowing the optical waveguide at its central portion. FIG. 12A is a schematic view of an optical waveguide whose width is changed at a central portion, FIG. 12B is a graph of the electric field strength distribution of the forward and backward waves R and S in the axial direction, and FIG. 12C is a graph of the intensity distribution of a beam radiated in a direction perpendicular to a substrate along the axial direction, that is proportional to $|R+S|^2$.

The feature of this optical waveguide is that strong radiation is obtained in a direction perpendicular to the substrate at a certain portion of the phase shift structure in which the phase gradually changes. The radiation pattern at this time can be controlled by the shape and arrangement of the phase shift structure. In the optical waveguide having this structure, when a beam comes from the direction perpendicular to the substrate to a phase shift region where a strong radiation pattern is obtained in the direction perpendicular to the substrate, the incident beam is coupled to the optical waveguide.

Figure 13A:
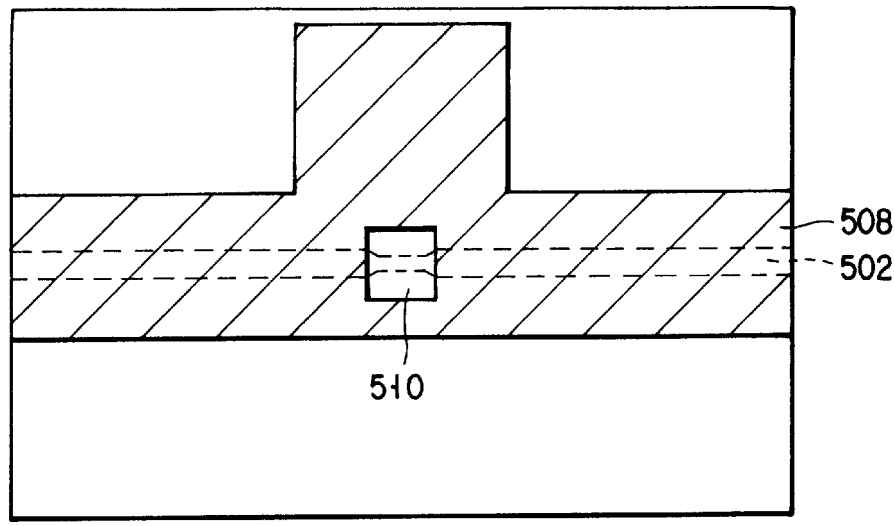
FIGS. 13A to 13C are a plan view, a longitudinal sectional front view, and a longitudinal sectional side view, respectively, showing the schematic arrangement of a surface semiconductor optical amplifier according to still another embodiment of the present invention.
Figure 13B:
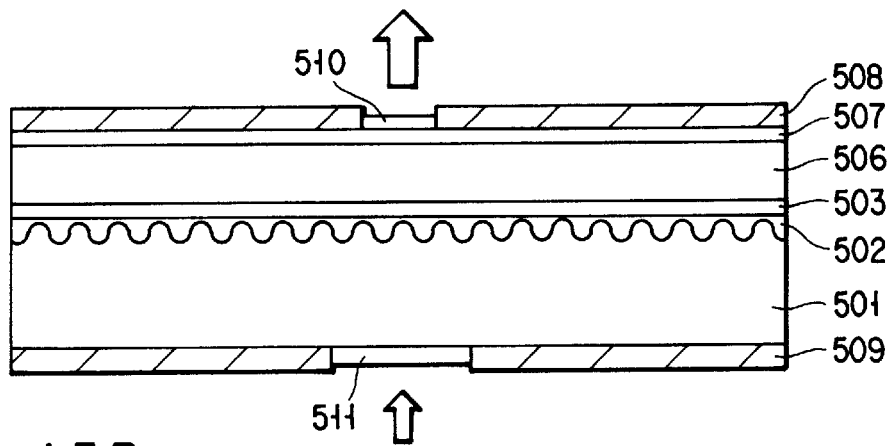
Figure 13C:
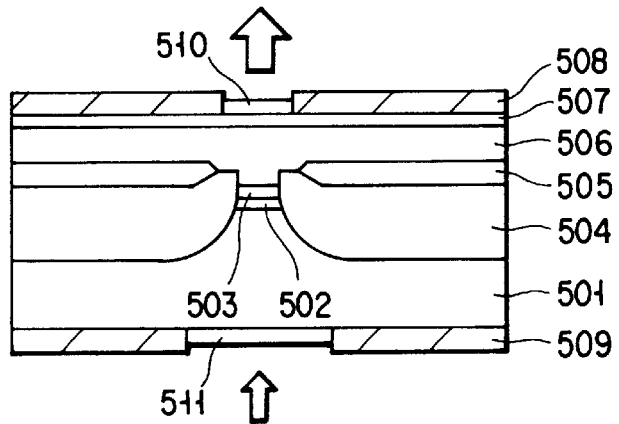

FIGS. 13A to 13C are a plane view, a longitudinal sectional front view, and a longitudinal sectional side view, respectively, showing the schematic arrangement of a surface semiconductor optical amplifier according to still another embodiment of the present invention.

As shown in FIGS. 13A to 13C, an InGaAsP optical waveguide layer 502 (composition wavelength: 1.15 μm), an active layer 503 (composition wavelength: 1.3 μm), an Fe-doped semi-insulating InP layer 504, an n-InP layer 505, a p-InP cladding layer 506, and a p-InGaAsP contact layer 507 (composition wavelength: 1.15 μm) are formed on an n-InP substrate 501. A p-side electrode 508 and an n-side electrode 509 are respectively arranged on the p-InGaAsP contact layer 507 and the lower surface of the n-InP substrate 501. In the light input and output regions, the electrodes 508 and 509 are removed, and SiN anti-reflection coating films 510 and 511 are applied instead.

A second-order diffraction grating having a period of 420 nm is formed around the InGaAsP optical waveguide layer 502, and its portion over 10 μm around the center has a narrow phase shift structure. At portions immediately above and below this phase shift structure, opening portions are formed in the electrodes 508 and 509, and the anti-reflection coating films 510 and 511 are formed. With this structure, an input beam can be sent from the lower side of the substrate, and an output beam can be extracted from the upper side of the substrate.

The optical amplifier of the embodiment shown in FIGS. 13A to 13C is used while a bias current that does not cause laser oscillation is flowed from the electrodes 508 and 509. In this state, a weak input beam with a wavelength of 1.3 μm which enters from the lower side of the substrate is amplified by the optical waveguide arranged in a direction parallel to the substrate, and extracted as an output beam having a sufficient power from the upper side of the substrate. That is, the input beam incident on a portion of the phase shift structure is coupled with the optical waveguide having a diffraction grating which is arranged in a direction parallel to the active layer, amplified while propagating along the active layer in the horizontal direction, and emitted as an output beam in a direction perpendicular to the substrate. Since the optical waveguide in the direction parallel to the substrate can be made as long as several hundred μm or more, a sufficient amplification factor can be obtained. The surface semiconductor optical amplifier having this structure also has the following advantages in addition to a sufficient amplification factor.

First, the beam shape of the output beam can be controlled by the phase shift structure. For example, in the structure shown in FIGS. 13A to 13C, the beam shape of the output beam is a shape which can be approximated by a Gaussian distribution, and coupling with the optical fiber can be efficiently performed. If two phase shift structures that relatively abruptly change the phase are used, an output beam having nearly a rectangular beam shape can also be extracted.

Second, since the beam shape of the output beam is determined by only the phase shift structure independently of the beam shape of the input beam, the beam shaping function is also one feature of the surface optical amplifier of the present invention. Third, since the surface optical amplifier of the present invention has an amplifying function for only a beam corresponding to the Bragg wavelength of the diffraction grating, it also functions as a wavelength filter.

Although the above embodiment has exemplified the 1.3-μm band surface semiconductor amplifier using an InP-based material, the present invention is not limited to this embodiment. The present invention is similarly applied to another material system such as a GaAs system, or another wavelength band. In the above embodiment, although the method of changing the width of the optical waveguide is used as the phase shift structure of the diffraction grating, a so-called chirped grating in which the period of the phase is gradually changed, or the like may be used.

Figure 17:
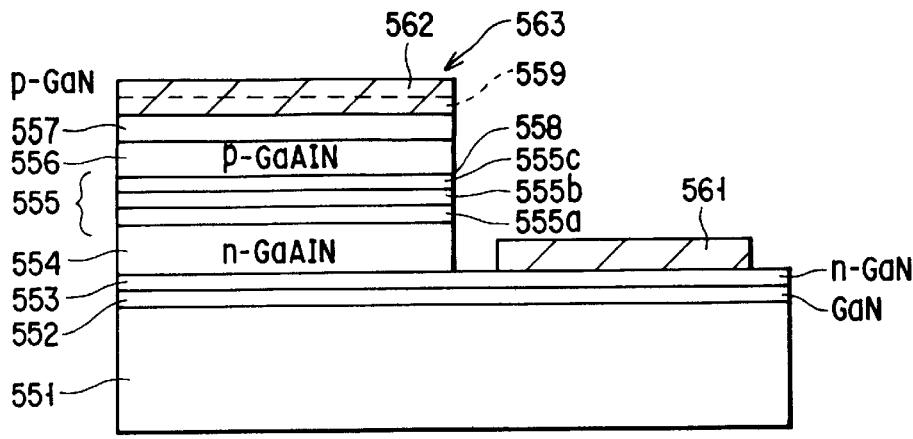
FIG. 17 is a sectional view along a direction perpendicular to the waveguiding direction showing the schematic structure of a surface emitting laser according to still another embodiment of the present invention.

FIG. 17 is a sectional view perpendicular to the waveguiding direction showing a grating coupled surface emitting laser according to still another embodiment of the present invention.

As shown in FIG. 17, an undoped GaN buffer layer 552, an n-GaN contact layer 553, an n-GaAlN cladding layer 554, an active layer 555, a p-GaAlN cladding layer 556, and a p-GaN contact layer 557 are formed on a sapphire substrate 551. The active layer 555 has a stacked structure having an undoped GaN light guide layer 555a, a quantum well layer 555b made from InGaN/InGaN, and a p-GaN light guide layer 555c. A second-order diffraction grating 558 is formed between the active layer 555 and the p-GaAlN cladding layer 556 so as to extend in a direction perpendicular to the sheet surface of FIG. 17. As described in the above several embodiments, the diffraction grating 558 has a phase shift structure so as to attain a Gaussian distribution for radiation-mode light.

The structure from the p-GaN contact layer 557 to the n-GaAlN cladding layer 554 is etched to expose part of the n-GaN contact layer 553, thereby forming a mesa 563. An n-side electrode 561 is formed on the surface of the exposed n-GaN contact layer 553, and a p-side electrode 562 is formed on the surface of the p-contact layer 557. An opening portion is formed in the p-side electrode 562 in correspondence with a light extraction region above the p-contact layer 557, and the p-contact layer 557 is covered with a fluorescent layer 559 in correspondence with this opening portion.

In the laser of this embodiment, since the fluorescent layer 559 is arranged in the radiation-mode light travel direction perpendicular to the waveguide, the output beam becomes a white beam. A white light source using an ultraviolet emitting diode and a fluorescent has conventionally been known. According to the present invention, a laser white light source having a strong emission intensity and an ideal intensity distribution can be provided. In an experiment, a high-luminance white beam having almost a Gaussian distribution was observed from the light extraction region of the laser of this embodiment.

Although this embodiment shows the detailed compositions of the respective layers, they can be variously changed within the range of the composition formula: $In_xGa_yAl_{1-x-y}N$ ($0 \leq x \leq 1$, $0 \leq y \leq 11$).

Figure 18A:
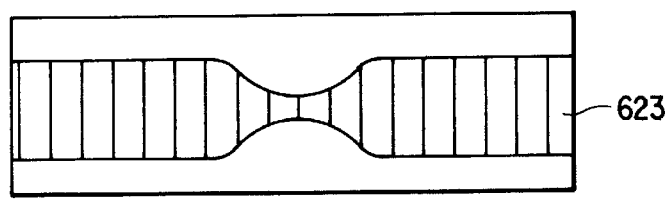
FIGS. 18A to 18C are a plan view and a sectional view showing the schematic structure of a grating coupled surface emitting laser according to still another embodiment of the present invention, and a graph showing the refractive index of the waveguide, respectively.
Figure 18B:
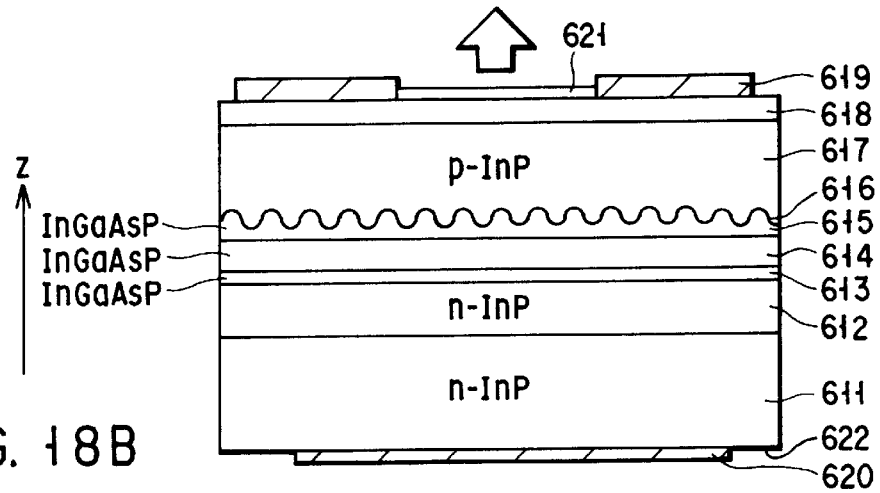
Figure 18C:
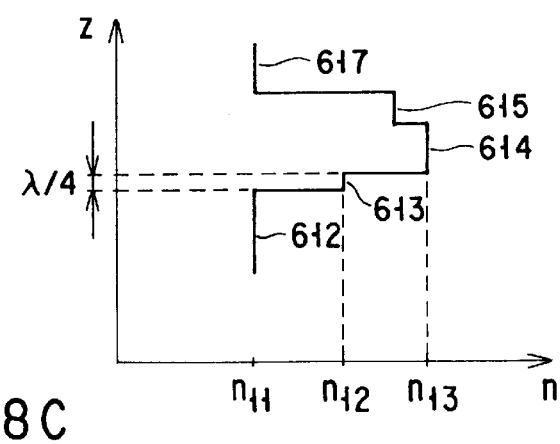

FIGS. 18A, 18B and 18C are a plan view and a sectional view showing the schematic structure of a grating coupled surface emitting laser according to still another embodiment of the present invention, and a graph showing the refractive index distribution of the waveguide, respectively.

As shown in FIGS. 18A and 18B, an n-InP cladding layer 612 having a thickness of 1.0 μm, an InGaP low-reflectivity layer 613 having a thickness d1, an InGaAsP active layer 614 having a thickness of 0.1 μm (composition wavelength: 1.55 μm), and an InGaAsP waveguide layer 615 having a thickness of 0.1 μm are formed on an n-InP substrate 611. A second-order diffraction grating 616 having a period of 480 nm is formed on the waveguide layer 615. The waveguide layer 615 is partially etched into a stripe shape.

A p-InP cladding layer 617 and a p$^+$-contact layer 618 are grown on the waveguide layer 615 and the exposed active layer 614. A p-side electrode 619 partially having an opening is formed on the contact layer 618, and an n-side electrode 620 is formed on the lower surface of the substrate 611. A frosted-glass-like work 622 is performed for the lower surface of the substrate 611 in order to prevent the beam radiated on the substrate side from returning upon being reflected by the electrode. An AR (Anti-Reflection) coat 621 for efficiently extracting an emitted beam is formed in the opening formed in the p-side electrode 619.

A stripe 623 defines the waveguide structure in the horizontal direction, and is narrowed over 20 μm around its center. As described above, if the stripe 623 is narrowed to attain a symmetrical distribution in the waveguide direction within a predetermined section, the emission output pattern in a cross section along the waveguiding direction of the radiation-mode light can have a Gaussian distribution.

FIG. 18C shows the refractive index of the waveguide in the vertical direction. In FIG. 18C, $n_{11}$, $n_{12}$, and $n_{13}$ respectively represent the refractive indexes of the InP cladding layer 612, the low-reflectivity layer 613, and the active layer 614, and λ represents the wavelength of the beam radiated in the vertical direction by the diffraction grating 616. If the composition of the low-reflectivity layer 613 is selected to satisfy $$n_{11} < n_{12} < n_{13},$$

reflection of the radiated beam at the interface can be suppressed. Particularly, if it satisfies $$n_{12} = (n_{11} \times n_{13})^{1/2}$$
$$d1 = /(4n_{12}) \times (\text{an odd number}),$$

the amplitude reflectivity at the waveguide interface which is normally about 0.08, as well known, can be suppressed to almost 0. For example, in this embodiment, since $n_{11}$=3.17, and $n_{13}$=3.70, $n_{12}$=3.42 suffices (which is equivalent to arsenic composition ratio: y=0.64).

At this time, the minimum value of d1 is 0.114 μm. Since a phase difference of λ/4 corresponds to π upon a round-trip, if a fabrication error of ±π/4 is allowed, its width is ±0.0285 μm.

In this manner, according to this embodiment, by introducing the low-reflectivity layer 613 into the waveguide, interface reflection can be suppressed, a decrease (ratio of up to 1.5) in total output caused by interference can be reduced, and variations in output at a ratio of ±1.5 can also be suppressed.

Figure 19A:
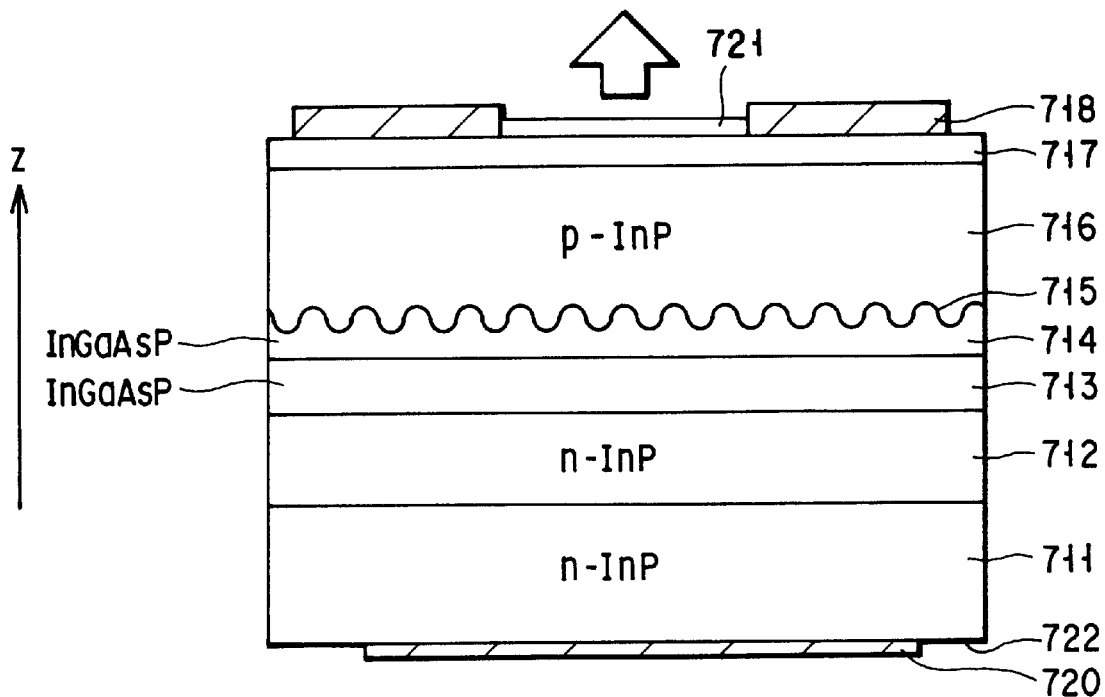
FIGS. 19A and 19B are a sectional view showing the schematic structure of a grating coupled surface emitting laser according to still another embodiment of the present invention, and a graph showing the refractive index of the waveguide, respectively.
Figure 19B:
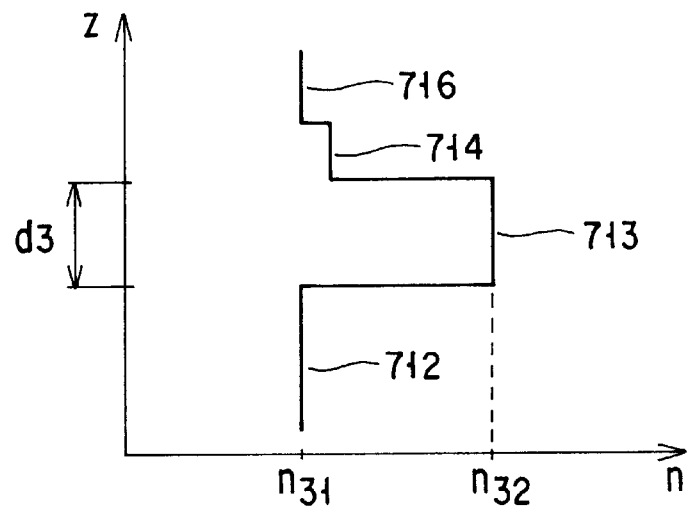

FIGS. 19A and 19B are a sectional view showing the schematic structure of a grating coupled surface emitting laser according to still another embodiment of the present invention, and a graph showing the refractive index of the waveguide, respectively.

As shown in FIG. 19A, an n-InP cladding layer 712, an InGaAsP active layer 713 (composition: 1.55 μm), an InGaAsP waveguide layer 714, a second-order diffraction grating 715 having a period of 480 nm, a p-InP cladding layer 716, and a p$^+$-contact layer 717 are formed on an n-InP substrate 711. A p-side electrode 718 and an n-side electrode 719 are respectively arranged on the p$^+$-contact layer 717 and the n-InP substrate 711. A frosted-glass-like work 722 is performed for the lower surface of the substrate 711 in order to prevent the beam radiated on the substrate side from returning upon being reflected by the electrode. An AR (Anti-Reflection) coat 721 for efficiently extracting an emitted beam is formed in an opening formed in the p-side electrode 718.

The waveguide layer 714 is partially etched into a stripe shape, and this stripe defines the waveguide structure in the horizontal direction. The width of the stripe is decreased to have a symmetrical distribution in the waveguide direction within a predetermined section. The stripe controls the emission output pattern in a cross section along the waveguiding direction of the radiation-mode light to have a Gaussian distribution.

FIG. 19B shows the reflective index of the waveguide in the vertical direction. In FIG. 19B, $n_{31}$ and $n_{32}$ respectively represent the refractive indexes of the cladding layer 712 and the active layer 713, d3 represents the thickness of the active layer, and λ represents the wavelength of the beam radiated in the vertical direction by the diffraction grating 715. As well known, if it satisfies $$n_{32} \times d1 = \lambda/2 \times (a\ whole\ number),$$

the resonance conditions of a resonator formed by the waveguide can be nearly satisfied, and the reflectivity of the resonator can be reduced.

In this manner, according to this embodiment, reflection of the radiation mode by the waveguide can be suppressed, a decrease (ratio of up to 1.5) in total output caused by interference can be reduced, and variations in output at a ratio of ±1.5 can also be suppressed.

FIGS. 20A and 20B are a sectional view showing the schematic structure of a grating coupled surface emitting laser according to still another embodiment of the present invention, and a graph showing the refractive index of the waveguide, respectively. This embodiment has a structure having a low-reflectivity layer on the waveguide, similar to the embodiment shown in FIGS. 18A to 18C. The same reference numerals denote the same parts, and a detailed description thereof will be omitted.

This embodiment is the same as the above embodiment except that the waveguide structure is vertically reversed. That is, a low-reflectivity layer 613 satisfies the same conditions as those in the embodiment shown in FIGS. 18A to 18C. According to this embodiment, by introducing the low-reflectivity layer 613 into the waveguide, interface reflection can be suppressed, and the extraction efficiency of a radiated beam on the surface side can be increased.

FIGS. 21A and 21B are a sectional view showing the schematic structure of a grating coupled surface emitting laser according to still another embodiment of the present invention, and a graph showing the refractive index of the waveguide, respectively. This embodiment has a structure in which the waveguide satisfies resonance conditions for a radiated beam, similar to the embodiment shown in FIGS. 19A and 19B. The same reference numerals denote the same parts, and a detailed description thereof will be omitted.

This embodiment is the same as the above embodiment except that the waveguide structure is vertically reversed. That is, an active layer 713 satisfies the same conditions as those in the embodiment shown in FIGS. 20A and 20C. According to this embodiment, since the active layer 713 satisfies the resonance conditions for a radiated beam, the reflection loss caused by a resonator formed by the waveguide can be reduced.

FIGS. 22 to 25 are sectional views each showing a grating coupled surface emitting laser according to still another embodiment of the present invention. These embodiments are the same as the embodiments shown in FIGS. 18A to 21B except that a DBR (Distributed Bragg Reflector) 624 or 724 is added as a reflecting mirror. The same reference numerals denote the same parts, and a detailed description thereof will be omitted.

Each of the embodiments shown in FIGS. 22, 23, 24, and 25 is an improvement of each of the embodiments shown in FIGS. 18A to 18C, 19A and 19B, 20A and 20B, and 21A and 21B. That is, in each of the structures shown in FIGS. 22 and 24, the DBR (Distributed Bragg Reflector) 624 is inserted as a reflecting mirror between an n-InP substrate 611 and an n-InP cladding layer 612. In each of the structures shown in FIGS. 23 and 25, the DBR (Distributed Bragg Reflector) 724 is inserted as a reflecting mirror between an n-InP substrate 711 and an n-InP cladding layer 712.

According to these embodiments, of two beams radiated by the diffraction grating, the beam radiated in a lower direction which is not the output side can be coupled to the beam radiated in an upper direction serving as the output side more efficiently than the above embodiments. In this case, the reflection loss caused by the waveguide interface is small. If the thickness of the cladding layer 612 or 712 is adjusted, the phases of the two radiated beams can be matched to obtain an output almost two times the output in the case of a single radiated beam. Note that the mirror is not limited to the DBR, and may be a dielectric mirror, or reflection of a lower electrode as far as the function is satisfied.

According to the embodiments shown in FIG. 18A to 25, weakening of the two beams radiated by the diffraction grating due to coupling upon reflection by the layer structure in the waveguide region and resultant interference with each other can be reduced. When the radiated beam is extracted to a side opposite to the active layer when viewed from the diffraction grating, the reflection loss accounted for by the layer structure can be reduced.

For example, a low-reflectivity structure can be arranged at part of the reflection interface of the layer structure constituted by the waveguide so as to suppress interference of radiation modes radiated from the diffraction grating in the layer structure. This structure is effective when the diffraction grating is formed in the main waveguide. More specifically, a film having a middle refractive index of a material constituting the interface, and a thickness ¼ the wavelength of a reflected beam is inserted in an interface on a side opposite to the diffraction grating when viewed from the active layer. With this arrangement, reflection in the waveguide where two beams are coupled can be suppressed to reduce the interference. When the radiated beam is extracted to a side opposite to the diffraction grating when viewed from the active layer, the reflection loss itself at the waveguide interface can be reduced.

To reduce the reflectivity of the main resonator structure formed by the waveguide region for the radiation mode, the resonance conditions of the resonator structure at the radiation mode wavelength can be satisfied by adjusting the layer thickness or refractive index in the resonator structure. This structure is effective when no diffraction grating is formed in the main waveguide. Accordingly, the resonator formed by the waveguide has a low reflectivity for a beam radiated from the diffraction grating, and coupling between the two beams radiated in opposite directions can be suppressed to reduce interference. When the radiated beam is extracted to a side opposite to the diffraction grating when viewed from the active layer, the reflection loss itself at the waveguide interface can be reduced.

The reflecting mirror can be further arranged on a side opposite to the diffraction grating when viewed from the active region. With this arrangement, a beam which is radiated to a side opposite to the output side and normally lost can be coupled to a beam radiated to the output side to effectively contribute to an output without being reduced by the resonator structure formed by the waveguide.

In the embodiments shown in FIGS. 18A to 25, to attain a Gaussian distribution for the emission output pattern of the radiation-mode light in a cross section along the waveguiding direction, the stripe width or phase of the diffraction grating is adjusted as a phase shift means. However, the structure features associated with a reduction in reflection loss, an increase in extraction efficiency of a radiated beam, and the like in these embodiments can also be utilized in a case using no phase shift means for attaining a Gaussian distribution. These structural features can be applied to not only an emission portion but also a reception portion, e.g., a coupler. The diffraction region can be different from the emission region. This structure may be changed to a structure in which a beam is extracted from not the upper side of the device but the lower side of the substrate. In the above-described embodiments, an InP system is used as a material system. Instead of this, e.g., a GaAs system, an InGaAlP system, a GaN system, or another optical material may be used.

According to the present invention, a grating coupled surface emitting device having a large output and a high coupling efficiency with an optical fiber or the like, e.g., a semiconductor laser or an optical amplifier can be realized by a simple structure. As a result, a low-cost emitting device having high reliability which is used in an optical network device or an optical processing system used in the fiber-optic subscriber system can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A grating coupled surface emitting device comprising:
   a semiconductor active layer;
   first and second semiconductor layers of first and second conductivity types arranged to interpose said active layer therebetween;
   first and second electrodes respectively connected to said first and second semiconductor layers;
   a waveguide configured to form guided-mode light having forward and backward wave components from light emitted from said active layer;
   a diffraction grating which is arranged in said waveguide and has an order not less than a second order for the guided-mode light, the guided-mode light being output as radiation-mode light in a direction perpendicular to said waveguide by said diffraction grating from an optical output portion; and
   a phase shifter configured to shift a phase of said diffraction grating, said phase shifter being arranged in a substantially symmetrical distribution shape over a distance larger than a period of said diffraction grating so as to bring the forward and backward wave components of the guided-mode light into interference to strengthen each other at a central portion of the radiation-mode light in outputting the forward and backward wave components as the radiation-mode light, and to bring the forward and backward wave components into interference to weaken each other at portions on two sides of the radiation-mode light, thereby attaining a Gaussian distribution for the radiation-mode light.

2. A device according to claim 1, wherein said phase shifter comprises means for changing a width or thickness of said waveguide including said diffraction grating.

3. A device according to claim 1, wherein said phase shifter comprises means for changing the period of said diffraction grating.

4. A device according to claim 1, wherein said phase shifter comprises means for changing a width or thickness of said waveguide including said diffraction grating, and for changing the period of said diffraction grating.

5. A device according to claim 1, wherein said diffraction grating is concentrically arranged.

6. A device according to claim 5, further comprising one or a plurality of stripe diffraction gratings radially arranged outside said concentric diffraction grating having said phase shift means.

7. A device according to claim 1, wherein diffraction gratings of a first order for the guided-mode light are arranged on two sides of said diffraction grating.

8. A device according to claim 1, wherein a region corresponding to said optical output portion in said waveguide is set to have an absorption edge wavelength shorter than those of regions on two sides.

9. A device according to claim 8, wherein the region corresponding to said optical output portion, and the regions on the two sides are made from materials having compositions different from each other.

10. A device according to claim 8, wherein the region corresponding to said optical output portion, and the regions on the two sides have multiple quantum well layers having well widths different from each other.

11. A device according to claim 1, further comprising a semiconductor lens which is arranged at said optical output portion, and made from a semiconductor transparent for the radiation-mode light.

12. A device according to claim 11, wherein said semiconductor lens is a convex lens and has a portion extending to a power feed region between said first and second electrodes across said output portion.

13. A device according to claim 1, wherein said active layer and said first and second semiconductor layers are essentially made from a material represented by a composition formula: $In_xGa_yAl_{1-x-y}N$ ($0 \leq x \leq 1$, $0 < y < 1$), and a fluorescent layer is formed at said optical output portion.

14. A device according to claim 1, further comprising a low-reflectivity layer arranged to oppose said diffraction grating via said active layer.

15. A device according to claim 14, further comprising a reflecting mirror layer arranged to oppose said optical output portion via said low-reflectivity layer.

16. The device according to claim 1, wherein said waveguide forms a resonator structure which satisfies a resonance condition for the radiation-mode light in order to decrease a reflectivity of the resonator structure.

17. A device according to claim 16, further comprising a reflecting mirror layer arranged to oppose said optical output portion via said resonator structure.

18. A device according to claim 1, further comprising an optical input portion arranged to oppose said optical output portion via said active layer and said waveguide, wherein said device functions as an optical amplifier.

19. A grating coupled surface emitting device comprising:

a semiconductor active layer;

first and second semiconductor layers of first and second conductivity types arranged to interpose said active layer therebetween;

first and second electrodes respectively connected to said first and second semiconductor layers;

a waveguide configured to form guided-mode light having forward and backward wave components from light emitted from said active layer; and a diffraction grating which is arranged in said waveguide and has an order not less than a second order for the guided-mode light, the guided-mode light being output as radiation-mode light in a direction perpendicular to said waveguide by said diffraction grating from an optical output portion, wherein a region corresponding to said optical output portion in said waveguide has an absorption edge wavelength shorter than those of regions on two sides.

20. A device according to claim 19, wherein the region corresponding to said optical output portion, and the regions on the two sides are made from materials having compositions different from each other.

21. A device according to claim 19, wherein the region corresponding to said optical output portion, and the regions on the two sides have multiple quantum well layers having well widths different from each other.

* * * * *